US011112298B2

(12) United States Patent
Amarloo et al.

(10) Patent No.: US 11,112,298 B2
(45) Date of Patent: Sep. 7, 2021

(54) VAPOR CELLS FOR IMAGING OF ELECTROMAGNETIC FIELDS

(71) Applicant: Quantum Valley Ideas Laboratories, Waterloo (CA)

(72) Inventors: Hadi Amarloo, Waterloo (CA); Jaime Ramirez-Serrano, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 16/996,652

(22) Filed: Aug. 18, 2020

(65) Prior Publication Data

US 2021/0156735 A1    May 27, 2021

Related U.S. Application Data

(60) Provisional application No. 62/941,572, filed on Nov. 27, 2019.

(51) Int. Cl.
   *G01J 1/02*     (2006.01)
   *G01R 29/08*    (2006.01)

(52) U.S. Cl.
   CPC ........ *G01J 1/0223* (2013.01); *G01R 29/0885* (2013.01)

(58) Field of Classification Search
   CPC .... G01J 5/0875; G01R 29/0885; G01N 21/29
   See application file for complete search history.

(56) References Cited

U.S. PATENT DOCUMENTS

| | | | |
|---|---|---|---|
| 6,331,208 B1 * | 12/2001 | Nishida | C30B 33/00 117/89 |
| 7,471,866 B2 | 12/2008 | Dumais et al. | |
| 7,645,681 B2 | 1/2010 | Okada | |
| 7,859,350 B1 | 12/2010 | Schwindt et al. | |
| 8,588,557 B2 | 11/2013 | Schmidt et al. | |
| 8,796,927 B2 | 8/2014 | Meinhold | |
| 8,906,470 B2 | 12/2014 | Overstolz et al. | |
| 8,970,309 B2 | 3/2015 | Sato et al. | |

(Continued)

OTHER PUBLICATIONS

USPTO, Notice of Allowance dated May 4, 2020, in U.S. Appl. No. 16/659,289, 10 pgs.

(Continued)

*Primary Examiner* — Yara B Green
(74) *Attorney, Agent, or Firm* — Henry Patent Law Firm PLLC

(57) ABSTRACT

Vapor cells are disclosed that include a dielectric body having a first surface and a second surface. The dielectric body includes a plurality of walls extending from the first surface to the second surface. A perimeter wall surrounds an open volume of the dielectric body and interconnected walls are arranged within the open volume to partition the open volume into a plurality of cells. Each cell has a first opening defined by the first surface and a second opening defined by the second surface. The vapor cells additionally include a first optical window covering the first openings and having a surface bonded to the first surface of the dielectric body to form a seal around each of the first openings. A second optical window covers the second openings and has a surface bonded to the second surface of the dielectric body to form a seal around each of the second openings.

30 Claims, 14 Drawing Sheets

(56) References Cited

U.S. PATENT DOCUMENTS

| | | | |
|---|---|---|---|
| 9,503,021 | B2 | 11/2016 | Hayashi et al. |
| 10,024,929 | B2 | 7/2018 | Parsa et al. |
| 10,370,760 | B2 | 8/2019 | Jacobs et al. |
| 10,509,065 | B1 | 12/2019 | Shaffer |
| 10,605,840 | B1 | 3/2020 | Amarloo et al. |
| 10,859,981 | B1 | 12/2020 | Ramirez-Serrano et al. |
| 2003/0079823 | A1 | 5/2003 | Sabia |
| 2005/0007118 | A1 | 1/2005 | Kitching et al. |
| 2008/0159679 | A1 | 7/2008 | Sigalas et al. |
| 2008/0219615 | A1 | 9/2008 | Cunningham |
| 2008/0252890 | A1 | 10/2008 | Noda et al. |
| 2009/0256638 | A1 | 10/2009 | Rosenbluh et al. |
| 2012/0243088 | A1 | 9/2012 | Nagasaka |
| 2013/0270434 | A1 | 10/2013 | Nelson et al. |
| 2014/0160474 | A1 | 6/2014 | Keller et al. |
| 2015/0192532 | A1 | 7/2015 | Clevenson et al. |
| 2016/0012930 | A1 | 1/2016 | Parsa et al. |
| 2016/0218726 | A1 | 7/2016 | Overstolz et al. |
| 2016/0363617 | A1 | 12/2016 | Anderson et al. |
| 2018/0212612 | A1 | 7/2018 | Park et al. |
| 2019/0187198 | A1 | 6/2019 | Anderson et al. |
| 2020/0333406 | A1* | 10/2020 | Gabrys .................... G04F 5/14 |

OTHER PUBLICATIONS

USPTO, Non-Final Office Action dated May 18, 2020, in U.S. Appl. No. 16/659,289, 12 pgs.

USPTO, Final Office Action dated Jun. 22, 2020, in U.S. Appl. No. 16/659,276, 13 pgs.

USPTO, Notice of Allowance dated Jul. 30, 2020, in U.S. Appl. No. 16/659,289, 13 pgs.

USPTO, Notice of Allowance dated Nov. 8, 2019, in U.S. Appl. No. 16/410,479, 14 pgs.

USPTO, Non-Final Office Action dated Apr. 30, 2020, in U.S. Appl. No. 16/659,276, 20 pgs.

USPTO, Non-Final Office Action dated Jan. 2, 2020, in U.S. Appl. No. 16/659,289, 26 pgs.

USPTO, Final Office Action dated Feb. 10, 2020, in U.S. Appl. No. 16/659,289, 29 pgs.

USPTO, Non-Final Office Action dated Jun. 24, 2019, in U.S. Appl. No. 16/410,479, 34 pgs.

https://cdn.rohde-schwarz.com/dk/seminars_workshops/BaseStationInstallationandAntennaTesting_2017_V1_Shared_DK.pdf retrieved Nov. 7, 2018, 40 pgs.

USPTO, Restriction Requirement dated Jan. 10, 2020, in U.S. Appl. No. 16/659,276, 6 pgs.

USPTO, Notice of Allowance dated Oct. 2, 2019, in U.S. Appl. No. 16/410,479, 9 pgs.

Wikipedia, "Hydroxide," retrieved from https://en.wikipedia.org/wiki/Hydroxide on Feb. 5, 2020, 2020, 7 pgs.

"Analyzing RFoCPRI(TM) at Fiber-Based Cell Sites", https://www.viavisolutions.com/en-us/literature/analyzing-rfocpri-fiber-based-cell-sites-application-notes-en.pdf retrieved Nov. 7, 2018, 2 pgs.

"Drone Cell Tower Inspection, Survey, Thermal Imaging and LIDAR", https://abjdrones.com/drone-cell-tower-inspection-services retrieved Nov. 7, 2018, 6 pgs.

"inUAVI: Developing advanced electronic sensors and payloads for UAV's and Aerospace", http://inuavi.io retrieved Nov. 7, 2018, 5 pgs.

Amarloo , et al., "A Vapor Cell for Electromagnetic Imaging Using Rydberg Atom-based Electrometry", Aug. 9, 2019, 6 pgs.

Anderson , et al., "A self-calibrating Si-traceable broadband Rydberg atom-based radio-frequency electric field probe and measurement instrument", arXiv:1910.07107v2 [physics.atom-ph], Oct. 18, 2019, 12 pgs.

Chutani , "Design, Technology and Packaging of Cesium Vapor Cells for MEMS Atomic Clocks", Dissertation, Engineering Sciences, Université de Franche-Comté, 2011, 37 pgs.

Fan , et al., "Atom based RF electric field sensing", Journal of Physics B: Atomic, Molecular and Optical Physics, Sep. 9, 2015, 17 pgs.

Fan , et al., "Dispersive radio frequency electrometry using Rydberg atoms in a prism-shaped atomic vapor cell", J. Phys. B: At. Mol. Opt. Phys. 49, 2016, 8 pgs.

Fan , et al., "Effect of Vapor-Cell Geometry on Rydberg-Atom-Based Measurements of Radio-Frequency Electric Fields", Physical Review Applied 4, 044015, 2015, 7 pgs.

Fan , et al., "Subwavelength microwave electric-field imaging using Rydberg atoms inside atomic vapor cells", Optics Letters, vol. 39, No. 10, May 15, 2014, 4 pgs.

Goodman , "Introduction to Fourier Optics", McGraw-Hill Companies, Inc., 1968, 457 pgs.

Gosele , et al., "Wafer bonding for microsystems technologies", Sensors and Actuators 74, 161-168, 1999, 8 pgs.

Holloway , et al., "Atom-Based RF Electric Field Measurements: An Initial Investigation of the Measurement Uncertainties", IEEE International Symposium on Electromagnetic Compatibility, 2015, 6 pgs.

Karlen , "Fabrication and Characterization of MEMS alkali vapor cells used in chip-scale atomic clocks and other atomic devices", Dissertation, Univ. of Neuchâtel, 2018, 156 pgs.

Knapkiewicz , "Technological Assessment of MEMS Alkali Vapor Cells for Atomic References", micromachines, 10,25, Dec. 31, 2018, 20 pgs.

<Umar , et al., "Atom-Based Sensing of Weak Radio Frequency Electric Fields Using Homodyne Readout", Scientific Reports 7:42981, Feb. 20, 2017, 10 pgs.

Kumar , et al., "Rydberg-atom based radio-frequency electrometry using frequency modulation spectroscopy in room temperature vapor cells", Optics Express, vol. 25, No. 8, Apr. 17, 2017, 13 pgs.

Masteika , et al., "A Review of Hydrophilic Silicon Wafer Bonding", ECS Journal of Solid State Science and Technology, 3 (4) Q42-Q54, 2014, 13 pgs.

Nie , et al., "Pressure Aided Low Temperature Direct Bonding of Silicon Wafers with High Surface Roughness", 2006 1st IEEE Intl Conf on Nano/Micro Engineered and Molecular Systems, Jan. 18, 2006, 5 pgs.

Qin , et al., "Low-Temperature Bonding for Silicon-Based Micro-Optical Systems", Photonics, vol. 2, No. 4, Multidisciplinary Digital Publishing Institute, Dec. 15, 2015, 38 pgs.

Schnars , "Direct phase determination in hologram interferometry with use of digitally recorded holograms", J.Opt.Soc.Am.A, vol. 11, No. 7, Jul. 1994, 5 pgs.

Sedlacek , et al., "Atom-Based Vector Microwave Electrometry Using Ribidium Rydberg Atoms in a Vapor Cell", Physical Review Letters, Aug. 6, 2013, 5 pgs.

Sedlacek , et al., "Microwave electrometry with Rydberg atoms in a vapour cell using bright atomic resonances", Nature Physics, Sep. 16, 2012, 6 pgs.

Sedlacek , et al., "Quantum Assisted Electrometry using Bright Atomic Resonances", arXiv:1205.4461v1 [physics.atom-ph], May 20, 2012, 15 pgs.

Shaffer , et al., "A read-out enhancement for microwave electric field sensing with Rydberg atoms", SPIE Photonics Europe, 2018, Strasbourg, France, 2018, 11 pgs.

Suni , et al., "Effects of Plasma Activation on Hydrophilic Bonding of Si and $SiO_2$", Journal of the Electrochemical Society, 149 (6) G348-G351, 2002, 4 pgs.

Tong , et al., "Low Temperature Wafer Direct Bonding", Journal of Microelectromechanical Systems, vol. 3, No. 1, Mar. 1994, 7 pgs.

Vrijsen , "Collective Quantum Behavior of Atomic Ensembles in High-Finesse Optical Cavities", Dissertation, Stanford University., Dec. 2011, 112 pgs.

Ye , et al., "Molecular Iodine Clock", Physical Review Letters 87, 27, 270801, Dec. 31, 2001, 4 pgs.

WIPO, International Search Report and Written Opinion dated Dec. 10, 2020, in PCT/CA2020/051271, 8 pgs.

Subramonian , et al., "Micro-drilling of silicon wafer by industrical $CO_2$ laser", International Journal of Mechanical and Materials Engineering, Feb. 26, 2015, 6 pgs.

(56) References Cited

OTHER PUBLICATIONS

WIPO, International Search Report and Written Opinion dated Dec. 22, 2020, in PCT/CA2020/051269, 9 pgs.
Noda, "Photonic Crystals", Comprehensive Microsystems, 2008, 12 pgs.
Sievenpiper, et al., "Two-dimensional photonic-crystal vertical-cavity array for nonlinear optical image processing", Applied optics 37.11, Apr. 10, 2998, 5 pgs.
Vignolini, et al., "Near-field imaging of coupled photonic-crystal microcavities", Applied Physics letters 94.15, Apr. 14, 2009, 4 pgs.
USPTO, Notice of Allowance dated Apr. 27, 2021, in U.S. Appl. No. 16/996,663, 17 pgs.
USPTO, Non-Final Office Action dated Dec. 28, 2020, in U.S. Appl. No. 16/996,663, 18 pgs.

\* cited by examiner

Pocket size: 0.8 X 0.8 mm, 0.15 mm deep

Each triangle has 1 mm base and 3 mm height

VAPOR CELLS FOR IMAGING OF ELECTROMAGNETIC FIELDS

CROSS-REFERENCE TO RELATED APPLICATIONS

This application claims priority to U.S. Provisional Application No. 62/941,572 filed Nov. 27, 2019, and entitled, "Vapor Cells for Imaging of Electromagnetic Fields," the disclosure of which is hereby incorporated by reference.

BACKGROUND

The following description relates to vapor cells for imaging of electromagnetic fields.

Over-the-air (OTA) testing is important for many systems that utilize electromagnetic radiation for obtaining and communicating information (e.g., radar systems, medical imaging systems, cellular systems, etc.). Moreover, the testing of such systems during their design, manufacturing, and deployment is also important to ensure regulatory compliance. The challenges of such testing increase as the electromagnetic frequencies utilized by the systems scale to higher frequencies (e.g., greater than 30 GHz) and as integration between multiple components in the systems becomes more tightly knit. An example of system integration in high-frequency electronics is the merging of antennas with transceiver systems and amplifiers. Testing of such highly-integrated and sophisticated systems, particularly in the mm-wave regime, is widely recognized as a looming problem for the automotive and transportation, radar and telecommunications industries.

DETAILED DESCRIPTION

Figure 1A:
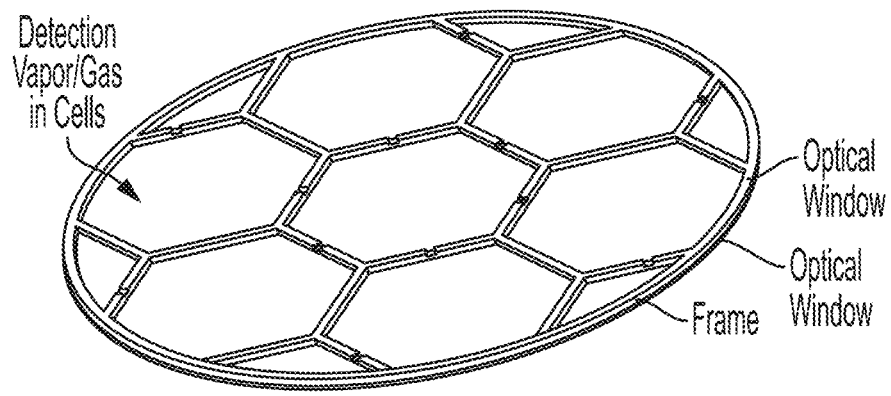
FIG. 1A is a schematic diagram of an example vapor cell having ribs or walls that define an internal support structure.

In a general aspect, vapor cells are disclosed for imaging electromagnetic radiation, including methods for manufacturing such vapor cells. In some implementations, the vapor cells include ribs that define an internal support structure and partition an internal volume of the vapor cells into a plurality of sub-volumes. The internal support structure may provide support to optical windows of the vapor cells. The plurality of sub-volumes may be identical in configuration (e.g., shape, size, etc.) and may define a periodic arrangement of sub-volumes. The methods of manufacturing may allow the fabrication of a thin vapor cell that can be used to image electromagnetic fields using Rydberg atom electrometry. The phase resolution across the vapor cell can be set by its thickness in comparison to the wavelength of the target radiation field and the spatial resolution of the optical fields used to prepare atoms in a vapor and readout their response.

In some implementations, vapor cells may be fabricated by creating a suitable frame and then bonding a thin dielectric mirror to the frame (e.g., bonding a Bragg reflector to the frame) that can reflect the optical fields or signals (e.g., laser beams) used to prepare atoms in a vapor and read them out. A first optical window can be bonded onto the frame; the first optical window may be a top optical window. Such bonding may involve frit bonding, anodic bonding, low-temperature contact bonding, or some other method of bonding. Low-temperature contact bonding may be used to seal a second optical window (e.g., a bottom optical window) to the vapor cell so that the atomic or molecular sample remains pure. However, in some variations, other methods of bonding may be used (e.g., frit bonding, anodic bonding, etc.) In some contexts, low-temperature contact bonding is advantageous over methods of bonding that require high temperatures and/or voltages. With these latter methods, significant outgassing may result, compromising the performance of the vapor cell when pure samples of atoms are utilized, such as for Rydberg atom-based electric field sensing.

In some variations, the frame includes a stem for introducing the atomic or molecular sample into the vapor cell after the second optical window is sealed to the frame. For example, the stem may be a tubular extension formed of vitreous silica (or quartz glass) that can be fused and closed after the atomic or molecular sample has been introduced. In some variations, the frame includes a fill hole for introducing a vapor (e.g., an atomic or molecular sample) into the vapor cell after the second optical window is sealed to the frame. The fill hole may be sealed at low temperatures by contact bonding a cover or plug to the fill hole. However, other sealing methods may be used.

In some implementations, vapor cells may be fabricated by creating the frame and then bonding an optical window with a dielectric mirror to the frame (e.g., a Bragg reflector) that can reflect the optical fields or signals (e.g., laser beams) used to prepare the atoms and read them out. A first optical window can be bonded onto the frame; the first optical window may be a top optical window. The first optical window may include a dielectric mirror. The dielectric mirror may be thin. In some instances, the dielectric mirror may be deposited on a surface of the first optical window. In other instances, the dielectric mirror is attached to a surface of the first optical window (e.g., via adhesive or glue).

In some implementations, vapor cells have ribs along the frame to prevent the optical windows from warping under atmospheric pressure, for instance, so that imaging of the light in different regions of the vapor cell can enable imaging of the incident electromagnetic fields with high spatial resolution. For example, cross-talk between different areas along the surface of the vapor cell can be minimized, thereby improving spatial resolution. In several implementations, a tapered index of refraction is used along the edges of the vapor cells to prevent wall reflections from interfering with the measurements. The optical windows can also be machined to reduce the reflection of the high frequency electromagnetic field that is to be imaged. In some variations, patterned walls can be machined to further reduce reflections from the walls, such as through attenuation of field amplitude. Furthermore, the ribs may have small gaps cut into them so that the gas inside the vapor cell, e.g. alkali atoms, can be uniformly distributed throughout the vapor cell.

In some cases, vapor cells can be used for vapor cell magnetometry. In implementations where the sealing bond takes place at about room temperature, anti-spin relaxation coatings can be applied to the vapor cells to increase their integration times. Such vapor cells can be optically coupled through free space or by waveguides such as optical-fiber bundles.

The use of Rydberg atoms for electrometry has led to accurate, absolute measurements of high frequency electric fields (HFE). There are a number of antenna measurement applications for which this technology holds considerable promise for advancing the state-of-the-art. However, there are challenges at certain ranges of antenna size (both small and large) as well at high power. These challenges may be mitigated by a more electromagnetically transparent and conductor-free HFE probe than anything used today. The use of a dielectric probe can drive down the achievable error floor in these measurements while providing a means to drastically reduce costs, therefore opening new application spaces. Over the air (OTA) testing of high frequency electronics is becoming more and more important as the integration of these devices increases, making them extremely difficult to test using traditional methods. By almost completely removing undesirable materials from the probe, measurements of exceptionally high accuracy can be achieved, which is important for determining the electromagnetic fields emitted from a device under test (DUT).

The technologies presented herein allow the construction and operation of a vapor cell, electric field imaging device, for example, a CCD for HFE, such as shown in FIGS. 1A-1E. Using atom-based electric field sensing, the spatial and phase resolution that can be obtained can allow imaging of both phase and amplitude in a plane near to a DUT. The amplitude and phase information across the plane of the vapor cell sensor can be used to propagate the field to another location using well-known routines such as those based on Fresnel theory.

Accurate measurements of antenna radiation patterns are often required for validating the engineering science of antenna design as well as ensuring that antennas operate as intended in their given application. Electromagnetic radiation from other types of devices are also import to test, e.g., EMI from other HFE devices such as amplifiers. State-of-the-art approaches to antenna pattern measurement usually rely on a field probe that is a conducting antenna, with both the probe and antenna under test (AUT) surrounded by a large anechoic chamber. These chambers are typically large, sealed metallic boxes that are coated internally with foam that absorbs all radiation. Metal cables must be run to and from the AUT and probe to make even the most basic measurements. Metal structures in the positioning equipment provide additional complexity to the environment and are sources of error.

With the more flexible Rydberg atom-based technology, such as described herein, the size of the anechoic chambers can be more readily tailored to individual applications, easing the chamber cost-to-performance significantly. For electrically small antennas—those whose dimensions are small relative to their operating wavelength—the presence of excess metal structures compounds the difficult challenge of ensuring adequate absorption of their radiation at all but the desired directions. For pattern measurements of power only, the Rydberg atom electrometer does not require synchronization between the antenna and probe; allowing the AUT to be fed by a millimeter-scale, lightweight oscillator, removing the need for cables altogether.

In some implementations, vapor cells presented in this disclosure allow a multiple field point imaging device for imaging the amplitude and phase of an electromagnetic field produced by a high frequency electronic device, like an antenna. Such an imaging device can be lightweight and portable allowing very accurate calibrations of antennas in the field or on assembly lines. Such characterization may be invaluable for many applications in communications, automotive radar, electronics, weather radar and military radar. The imaging devices based on the vapor cells disclosed herein are suitable for imaging electromagnetic fields emanating from a DUT for over the air testing (OTA). OTA is desirable because it allows a noninvasive and non-destructive method to test a DUT. In some implementations, the vapor cells allow one or more of the following advantages: [1] dielectric in nature, [2] thinness (giving the phase resolution), [3] structural integrity, [4] broad area for intercepting electromagnetic fields, [5] uniformity of response, [6] reflective backing for imaging the optical read-out fields, [7] stemless configurations of the vapor cell, [8] the use of tapered dielectric properties for impedance matching to reduce reflections from the wall, [9] machining of the windows to reduce reflections, [10] patterning of the walls to reduce reflections, and [11] the ability to manufacture the vapor cells on industrial scale, in different sizes and for different frequencies of electromagnetic radiation. Other advantages are possible. The integration of these characteristics into a single vapor cell is highly advantageous and may allow the vapor cell to be used for electric field imaging using atom-based electric field sensing.

Figure 1B:
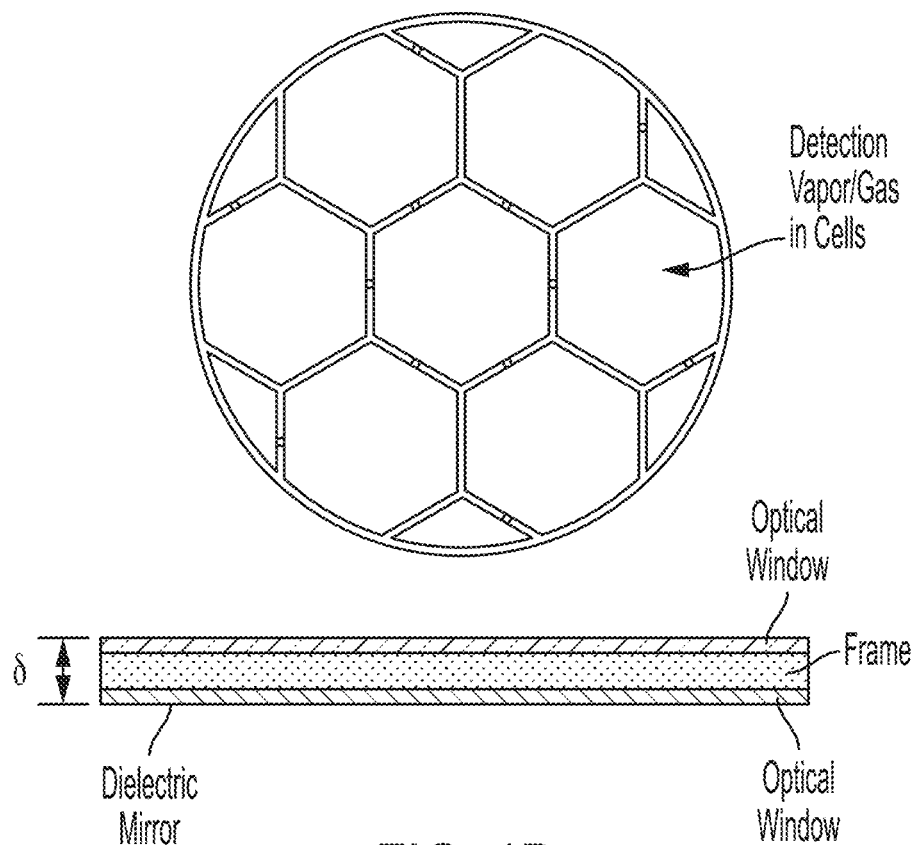
FIG. 1B presents a top view and a partial side view of the example vapor cell of FIG. 1A.

Example implementations of vapor cells are shown in FIGS. 1A-1E and 2A-2C. In particular, FIG. 1A shows a schematic diagram of an example vapor cell having ribs (or walls) that define an internal support structure. FIG. 1B presents a top view and a partial side view of the example vapor cell of FIG. 1A. The example vapor cell includes a frame and two optical windows. The frame may be laser cut, etched, or machined (or any combination thereof) from silicon or glass. However, other materials (e.g., sapphire) may be used. The frame includes ribbing or connecting walls that partition an internal volume into a plurality of sub-volumes or cells. The sub-volumes may be uniform in size and shape and may be disposed within the frame according to a periodic arrangement. A vapor or gas (or source thereof) for detecting a target radiation resides in the sub-volumes. Laser cutting makes the manufacture of the vapor cell more amenable to mass production. In many variations, the optical window on one side of the vapor cell (bottom) includes a multilayer Bragg reflector (or dielectric mirror) optimized for reflection of one or more of the optical signals (or beams of light) used to initialize and readout of the atoms in the vapor cell. The Bragg reflector may be made of alternating layers of $SiO_2$ and $TiO_2$. However, another types of layers and their arrangements may be used. In some variations, the last layer of the Bragg reflector is formed of $SiO_2$ so that the Bragg reflector can be contact bonded to the frame.

If the Bragg reflector is not made of $SiO_2$ but another material, it is still possible to place an $SiO_2$ adhesion layer onto the surface of the Bragg reflector. The $SiO_2$ adhesion layer may define or include a contact-bondable surface. Other materials are also possible. For example, a $TiO_2$ adhesion layer may be placed onto the surface of the Bragg reflector. This layer may define or include a contact-bondable surface. In some cases, the reflector needs to be dielectric and thin in order to reduce scattering of the incident field that is targeted for measurement. The top optical window can be affixed to the frame using a bonding technique that can utilize high temperatures and/or high voltages such as anodic or glass frit bonding. If the frame is made of glass, a thin layer of Si can be deposited on the frame material as an adhesion layer for anodic bonding. It is also possible to contact bond the top layer to the frame when both are formed from glass.

Figure 1C:
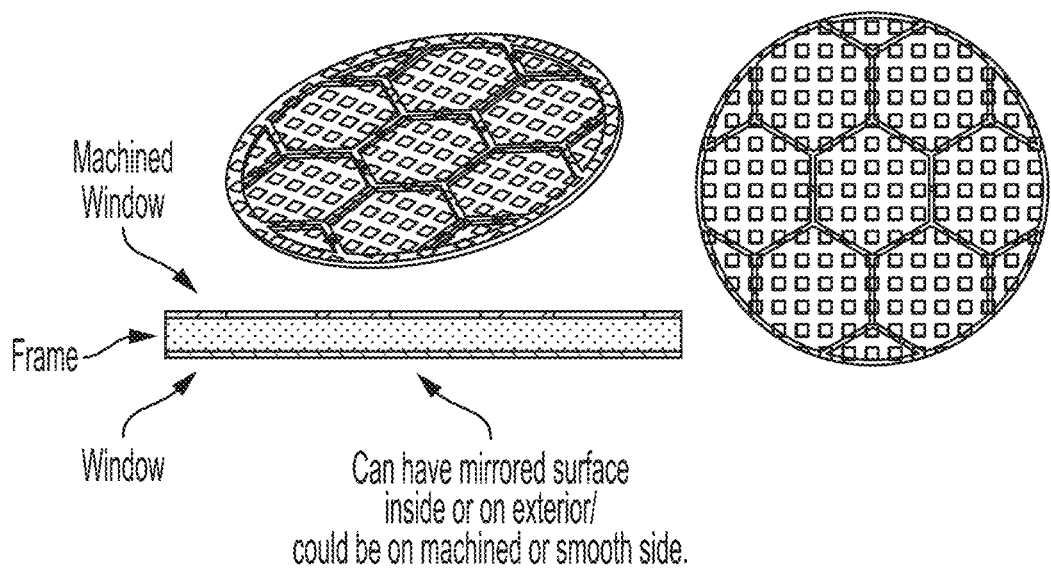
FIG. 1C is a schematic diagram of the example vapor cell of FIG. 1A, but in which one optical window includes pockets formed therein.
Figure 1D:
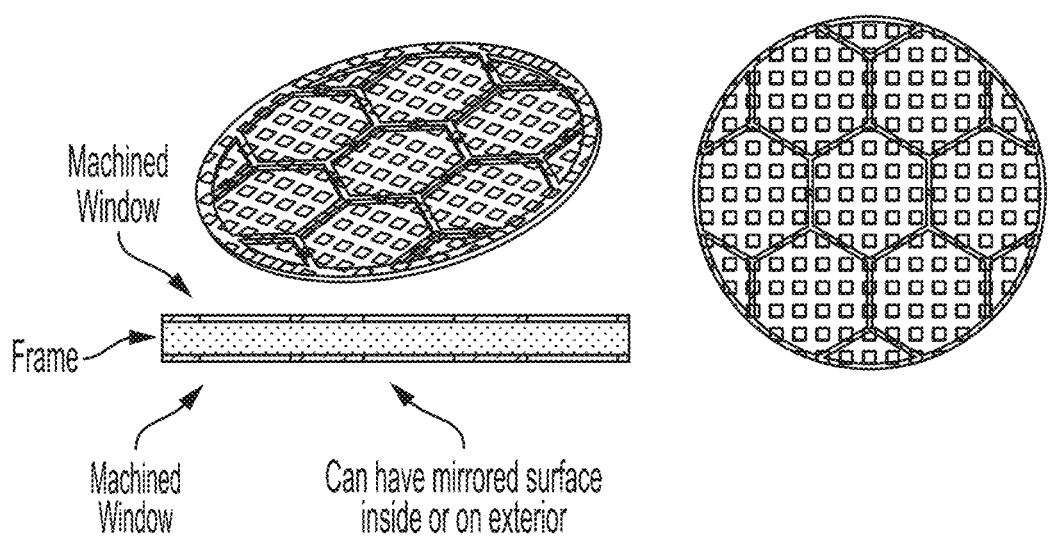
FIG. 1D is a schematic diagram of the example vapor cell of FIG. 1A, but in which two optical windows include pockets formed therein.

In some implementations, one or both of the optical windows may have pockets formed therein, such as by laser machining or etching. FIG. 1C presents a schematic diagram of the example vapor cell of FIG. 1A, but in which one optical window includes pockets formed therein. FIG. 1D presents a schematic diagram of the example vapor cell of FIG. 1A, but in which both optical windows include pockets formed therein. The pockets may be arranged to define a pattern. In some instances, the pockets are operable to reduce a quantity of material in the optical window while maintaining its structural integrity. In some instances, the pockets are operable to define an effective dielectric constant different from the intrinsic dielectric constant associated with a material forming the optical window. The effective dielectric constant may lower the possibility of an electromagnetic radiation entering the plurality of sub-volumes (e.g., a target radiation to be measured) from being reflected or scattered. However, other benefits are possible. In some of these implementations, one of the optical windows—e.g., the bottom optical window—includes a mirrored surface. The mirrored surface may be on an interior surface or an exterior surface of the optical window. If the optical window includes pockets, the pockets may define part or all of the exterior surface.

Figure 1E:
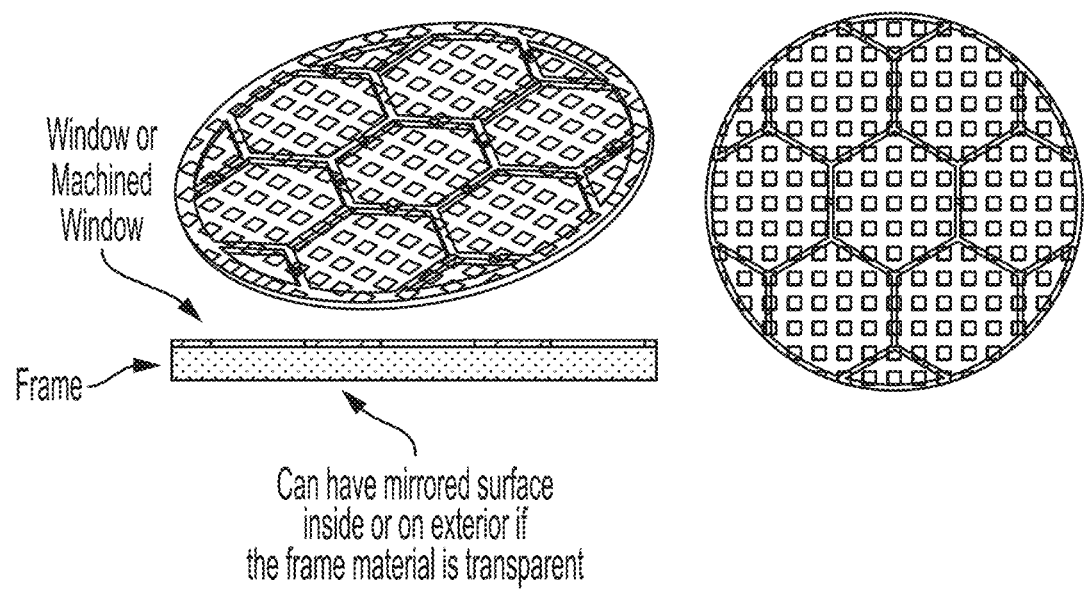
FIG. 1E is a schematic diagram of the example vapor cell of FIG. 1A, but in which a portion of the frame serves as a first optical window and a second optical window, bonded to the frame, includes pockets formed therein.

In some implementations, the example vapor cell includes an optical window that is integral to the frame, e.g., one of the two optical windows shown in FIGS. 1A & 1B is integral to the frame. The optical window may be defined by a wall of the frame, which may have an exterior surface that is flat. However, in some instances, the wall may include pockets along the exterior surface. FIG. 1E presents a schematic diagram of the example vapor cell of FIG. 1A, but in which a portion of the frame serves as an optical window. The portion may correspond to a wall of the frame and may have a mirrored surface on the inside. However, if the frame is made out of a transparent material (e.g., glass), the portion that is mirrored may be on an outside surface. In these implementations, a second optical window that is non-integral to the frame may be bonded to the frame to enclose vapor within the plurality of sub-volumes or cells. The second optical window may include pockets formed therein.

The vapor cells disclosed herein can have ribbing of the frame. The ribbing, as shown in FIGS. 1A-1E and 2A-2C, is chosen so that the deflection of the optical windows, e.g., due to atmospheric pressure, is minimized to allow for imaging of the light fields over the plane of the vapor cells. The optical windows are thin to reduce scattering of the field that is under test (FUT). This configuration allows for each ray of light emanating from a region of the vapor cell to carry spatial information about the incident electromagnetic field (RF-mm), i.e., the FUT. Typically, the spatial resolution of the optical imaging will determine the spatial resolution of the incident electromagnetic field (FUT). The ribs in the frame of the vapor cells have passages cut in them (e.g., notches, channels, etc.) so that gas or vapor can uniformly fill the vapor cell during manufacturing.

In some implementations, it may be possible to fill the vapor cell via a stem extending outward from vapor cell (e.g., a stem extending outward from a side of the vapor cell). The stem may correspond to a tubular structure that can be sealed, such as by fusing, after the vapor cell is filled. In some implementations, it may be optimal to fill the vapor cell through a small hole located in one of the optical windows or the side of the vapor cell in the frame. This small hole (or fill hole) can be contact bonded to seal the vapor cell. In this case the larger windows can be sealed using a high temperature and/or high voltage approach. The fill hole only needs to be large enough to out-gas the internal structure and allow for the filling of the vapor cell. In some variations, the fill hole is only required to be large enough to out-gas the vapor cell and enable it to be pumped down to the desired pressure. This latter method would be used if a chemically reactive method for filling can be implemented, e.g., getter source inside the vapor cell, another chemical release mechanism, or a thermally-activated method for the filling the internal volume with atomic or molecular species used for the measurement.

Figure 2A:
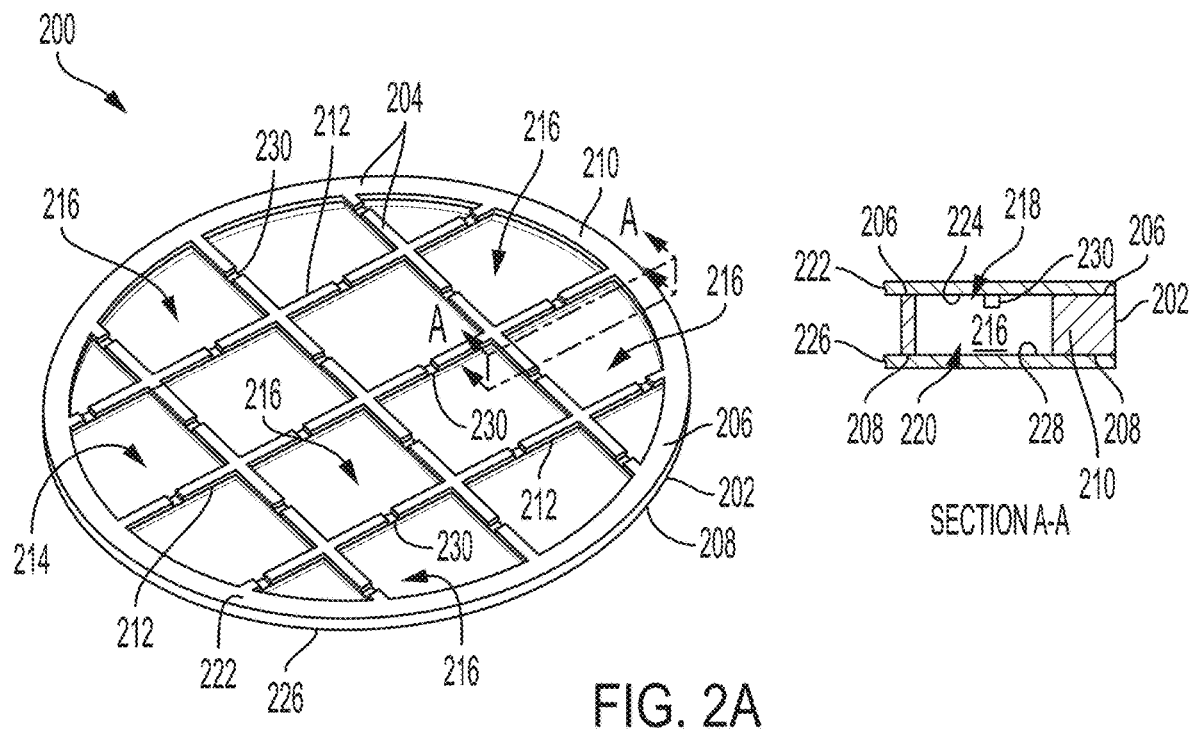
FIG. 2A is a schematic diagram of an example vapor cell having a dielectric body 202 that includes a plurality of walls defining a plurality of square cells.
Figure 2B:
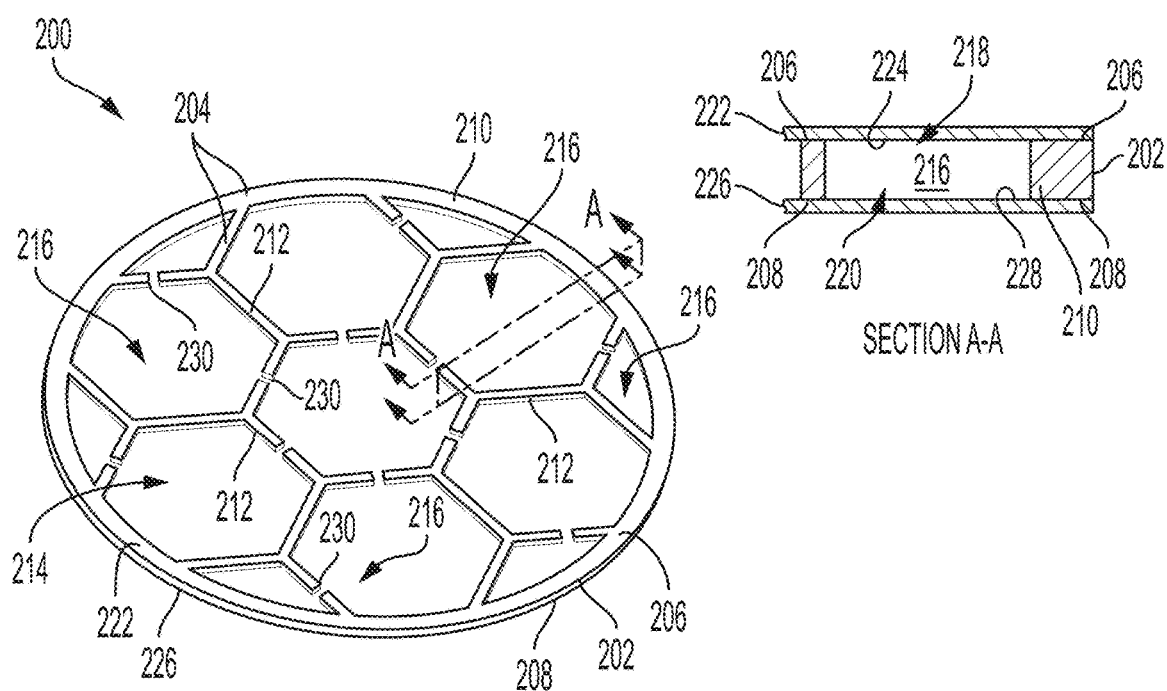
FIG. 2B is an alternate implementation of the example vapor cell of FIG. 2A in which the plurality of walls defines a plurality of hexagonal cells.

Now referring to FIG. 2A, a schematic diagram is presented of an example vapor cell 200 having a dielectric body 202 (or frame) that includes a plurality of walls 204 (or ribs). The plurality of walls 204 define square cells (or sub-volumes) within the dielectric body 202. However, the cells may have other shapes. For example, FIG. 2B presents an alternative implementation in which the plurality of walls 204 define hexagonal cells. The dielectric body 202 also includes a first surface 206 and a second surface 208. The second surface 208 is disposed opposite the first surface 206 and the plurality of walls 204 extends from the first surface 206 to the second surface 208. In some instances, the first and second surfaces 206, 208 are planar. In some instances, the first and second surfaces 206, 208 are parallel to each other. The plurality of walls 204 includes a perimeter wall 210 and multiple interconnected walls 212. The perimeter wall 210 surrounds an open volume 214 of the dielectric body 202 and the interconnected walls 212 are arranged within the open volume 214 to partition the open volume 214 into a plurality of cells 216. Each of the cells 216 has a first opening 218 defined by the first surface 206 and a second opening 220 defined by the second surface 208. In some variations, such as shown in FIGS. 2A-2B, the plurality of cells 216 define a periodic arrangement (e.g., a two-dimensional periodic arrangement).

The example dielectric body 202 may be formed of a material that is transparent to electric fields (or electromagnetic radiation) measured by the example vapor cell 200. The material may be an insulating material having a high resistivity, e.g., $\rho > 10^3$ $\Omega \cdot cm$, and may also correspond to a single crystal, a polycrystalline ceramic, or an amorphous glass. For example, the dielectric body 202 may be formed of silicon. In another example, the dielectric body 202 may be formed of a glass that includes silicon oxide (e.g., $Si_2$, $SiO_x$, etc.), such as vitreous silica, a borosilicate glass, or an aluminosilicate glass. In some instances, the material of the dielectric body 202 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:Zr_2$, $LaAlO_3$, etc.). In other instances, the material of the dielectric body 202 is a non-oxide material such as silicon (Si), diamond (C), gallium nitride (GaN), calcium fluoride (CaF), and so forth.

The example vapor cell 200 includes a first optical window 222 covering the first openings 218 and having a surface 224 bonded to the first surface 206 of the dielectric body 202 to form a seal around each of the first openings 218. A second optical window 226 covers the second openings 220 and also has a surface 228 bonded to the second surface 208 of the dielectric body 202 to form a seal around each of the second openings 220. The first and second optical windows 222, 226 may thus enclose a vapor (or a source of the vapor) in the plurality of cells 216. In some variations, the first optical window 222 includes a dielectric mirror, such as a Bragg reflector. The dielectric mirror may be disposed along the surface 224 of the first optical window 222 bonded to the first surface 206 of the dielectric body 202. In some variations, the second optical window 226 includes an anti-reflection coating.

The first and second optical windows 222, 226 may be formed of a material that is transparent to electromagnetic radiation (e.g., laser light) used to probe a vapor sealed within the plurality of cells 216 of the dielectric body 202. For example, the material of the first and second optical windows 222, 226 may be transparent to infrared wavelengths of electromagnetic radiation (e.g., 700-5000 nm), visible wavelengths of electromagnetic radiation (e.g., 400-700 nm), or ultraviolet wavelengths of electromagnetic radiation (e.g., 10-400 nm). Moreover, the material of the first and second optical windows 222, 226 may be an insulating material having a high resistivity, e.g., $\rho > 10^3$ $\Omega \cdot cm$, and may also correspond to a single crystal, a polycrystalline ceramic, or an amorphous glass. For example, the material of the first and second optical windows 222, 226 may include silicon oxide (e.g., $SiO_2$, $SiO_x$, etc.), such as found within quartz, vitreous silica, or a borosilicate glass. In another example, the material of the first and second optical windows 222, 226 may include aluminum oxide (e.g., $Al_2O_3$, $Al_xO_y$, etc.), such as found in sapphire or an aluminosilicate glass. In some instances, the material of the first and second optical windows 222, 226 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the material of the first and second optical windows 222, 226 is a non-oxide material such as diamond (C), calcium fluoride (CaF), and so forth.

Figure 2C:
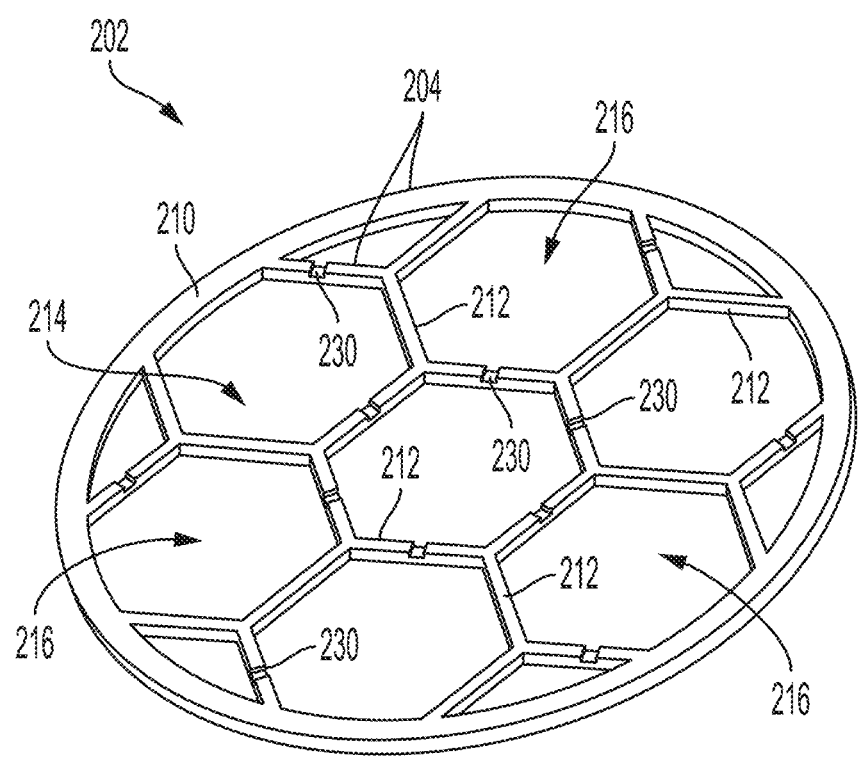
FIG. 2C is a schematic diagram of a dielectric body of the example vapor cell of FIG. 2B, but in which a portion of the dielectric body serves as an optical window.

In some implementations, one of the first and second optical windows 222, 226 is integral to the dielectric body 202. In these implementations, a portion of the dielectric body 202 serves as an optical window. For example, FIG. 2C presents a schematic diagram of the dielectric body 202 of FIG. 2B, but in which a portion of the dielectric body 202 serves as the second optical window 226. In FIG. 2C, the plurality of cells 216 extends from the first surface 206 partially through the dielectric body 202. The first optical window 222 encloses each cell 216 when forming a seal around their respective first openings 218. To manufacture the dielectric body 202 of FIG. 2C, a patterned layer may be applied to the first surface 206 of the dielectric body 202 that includes holes defining a shape of the plurality of cells 216. Portions of the first surface 206 exposed through holes may then be contacted with a chemical etchant. Other methods of manufacture are possible.

The example vapor cell 200 includes a vapor or a source of the vapor in each of the plurality of cells 216. The vapor may include constituents such as a gas of alkali-metal atoms, a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents. The source of the vapor may generate the vapor in response to an energetic stimulus, such as heat, exposure to ultraviolet radiation, and so forth. For example, the vapor may correspond to a gas of alkali-metal atoms and the source of the vapor may correspond to an alkali-metal mass sufficiently cooled to be in a solid or liquid phase when disposed into the plurality of cells 216. In some implementations, the source of the vapor resides in one or more cells 216 defined by the plurality of walls 204, and the source of the vapor includes a liquid or solid source of the alkali-metal atoms configured to generate a gas of the alkali-metal atoms when heated (e.g., an azide compound comprising the alkali metal atoms).

In many implementations, the interconnected walls 212 include passages (e.g., channels or grooves) to allow the vapor to flow between the plurality of cells 216. The passages may allow the example vapor cell 200 to maintain an equal distribution of vapor throughout the plurality of cells 216 during operation (e.g., equal pressure between cells 216, equal density of vapor in each cell 216, and so forth). The passages may also allow the plurality of cells 216 to be filled with vapor during manufacture. Filling with vapor may occur by introducing the vapor through a fill hole in the dielectric body 202, a fill hole in the first optical window 222, a fill hole in the second optical window 226, or some combination thereof. Such filling may also occur by stimulating, with energy (e.g., heat), a source of the vapor that has been disposed in one or more the plurality of cells 216. In some variations, such as shown in FIGS. 2A-2B, at least one of the interconnected walls 212 includes a passage 230 fluidly-coupling cells separated by the at least one interconnected wall. In some variations, three or more of the interconnected walls 212 meet at a union and the union includes a passage fluidly-coupling cells adjacent the union.

The interconnected walls 212 may be dimensioned (e.g., via a thickness, a width, a diameter, etc.) to allow the example vapor cell 200 to receive electromagnetic radiation across a large area while providing mechanical support to the first and second optical windows 222, 226. In some variations, the interconnected walls 212 occupy no more than 25 percent of the open volume 214 of the dielectric body 202. In some variations, the interconnected walls 212 occupy no more than 20 percent of the open volume 214 of the dielectric body 202. In some variations, the interconnected walls 212 occupy no more than 15 percent of the open volume 214 of the dielectric body 202. In some variations, the interconnected walls 212 occupy no more than 10 percent of the open volume 214 of the dielectric body 202. In some variations, the interconnected walls 212 occupy no more than 5 percent of the open volume 214 of the dielectric body 202. In some variations, the interconnected walls 212 occupy no more than 3 percent of the open volume 214 of the dielectric body 202.

In some implementations, the dielectric body 202 is thin such that each of the plurality of cells 216 defines a tabular cell. In these implementations, the dielectric body 202 may have a height defined by a distance between the first and second surfaces 206, 208 and a width defined by a maximum dimension along a direction perpendicular to the height. In some variations, the height is no greater than 10 percent of the width. In some variations, the height is no greater than 8 percent of the width. In some variations, the height is no greater than 6 percent of the width. In some variations, the height is no greater than 4 percent of the width. In some variations, the height is no greater than 2 percent of the width. In some variations, the height is no greater than 1 percent of the width. In some variations, the height is no greater than 0.5 percent of the width.

In some configurations, the example vapor cell 200 has one optical window lacking a dielectric mirror, e.g., the second optical window 226. This optical window can be anti-reflection coated for the optical fields or signals (e.g., beams of light). The optical window can also be coupled to a fiber array in some variations, although free space coupling is advantageous for reducing interference and scattering from the FUT. The first and second optical windows 222, 226 can also be machined to reduce the quantity of material but maintain structural integrity, such as shown in FIG. 3B. Machining the windows to reduce the amount of material reduces their effective dielectric constant and therefore reduces the reflectivity of the optical windows to the FUT. The machining thus reduces the effective index of refraction for the optical windows.

Figure 3A:
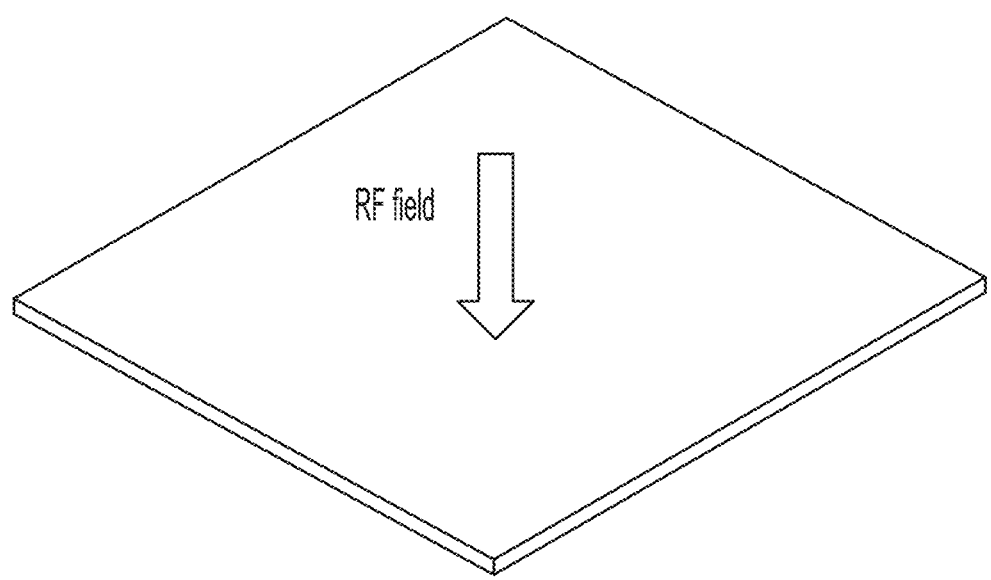
FIG. 3A is a graph showing a modeled reflection and transmission of an example flat optical window from 30 GHz to 50 GHz.
Figure 3A:
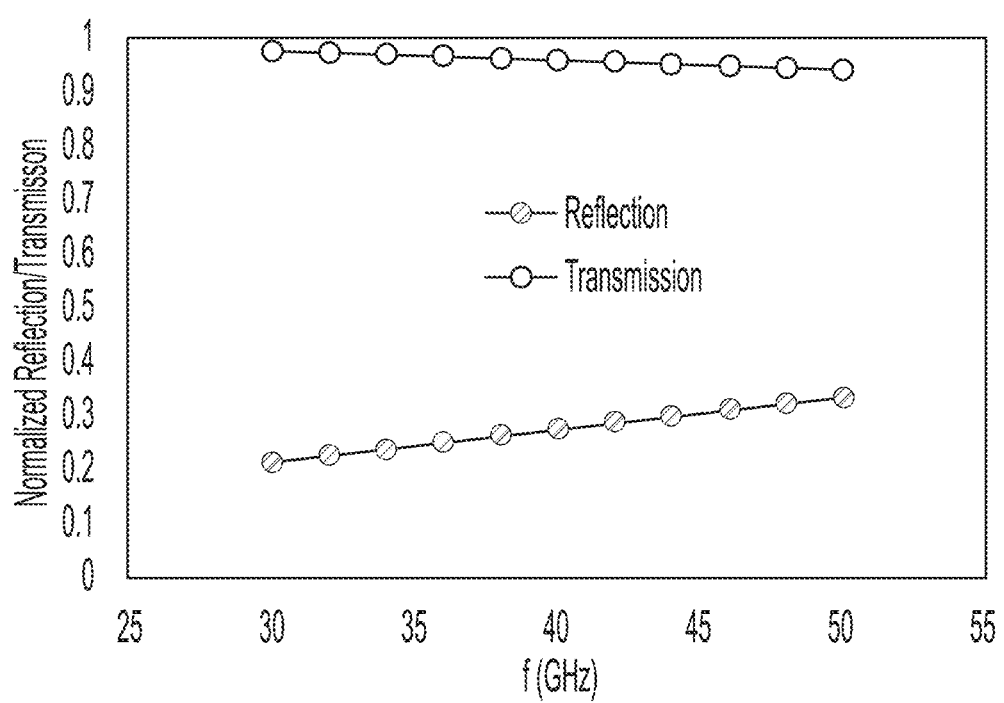
Figure 3B:
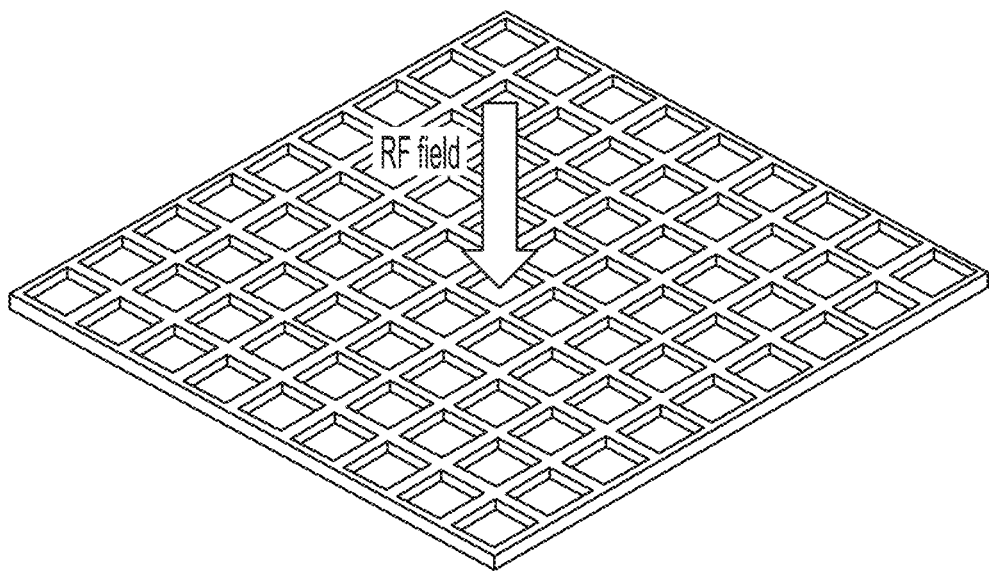
FIG. 3B is a graph showing a modeled reflection and transmission of an example patterned optical window from 30 GHz to 50 GHz.
Figure 3B:
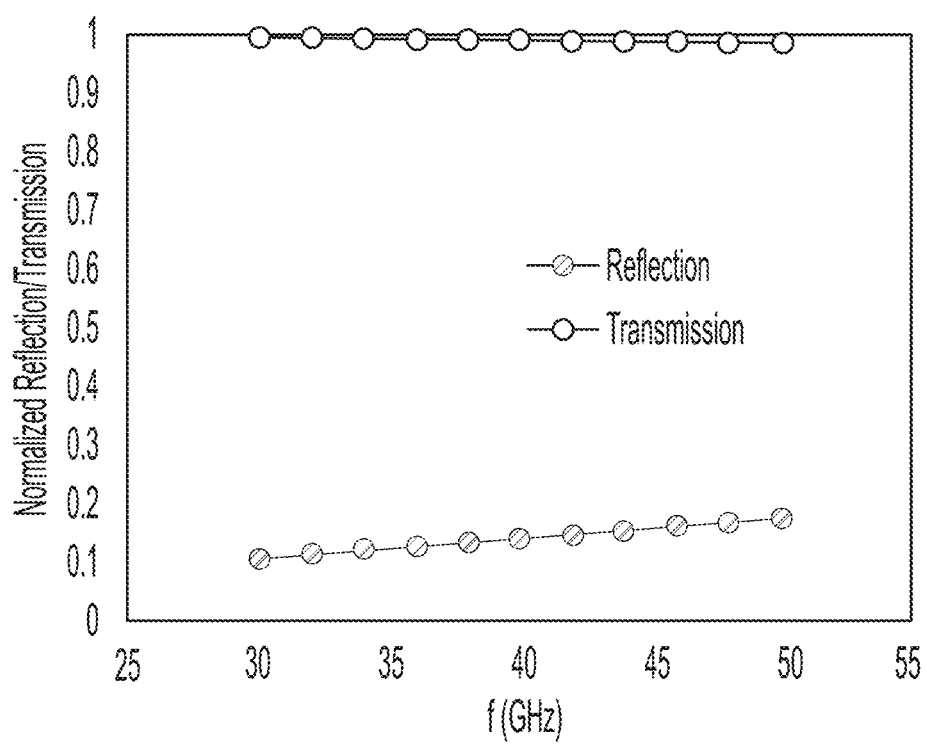

FIG. 3A presents a graph showing a modeled reflection and transmission of an example flat optical window from 30 GHz to 50 GHz, and FIG. 3B presents a graph showing a modeled reflection and transmission of an example patterned optical window from 30 GHz to 50 GHz. The patterned optical window has been machined on one surface to have an arrangement of wells or pockets. In some instances, the arrangement of wells or pockets may be periodic. The transmission of the patterned optical window is greater than that of the flat optical window, as shown by comparing the graphs of FIGS. 3A and 3B. The reflection from the patterned optical window is lower than that of the flat optical window. Other methods of changing the effective dielectric constant may be used, such as altering the material with a laser to change the dielectric constant (e.g., absorbing energy of the laser within the material).

Now referring back to FIGS. 2A-2B, in some implementations, one or both of the first optical window 222 and the second optical window 226 may have an effective dielectric constant different from an intrinsic dielectric constant associated with a material forming the optical window. In some implementations one or both of the first optical window 222 and the second optical window 226 may include a first window surface opposite a second window surface. In these implementations, the first window surface is bonded to the dielectric body 202 (e.g., surface 224 of the first optical window 222). A plurality of pockets extends partially from the second window surface to the first window surface. The plurality of pockets may be configured to reduce a quantity of material in the optical window while maintaining its structural integrity. In some instances, the plurality of pockets is arranged in size to define an effective dielectric constant for the optical window. The effective dielectric constant is different from the intrinsic dielectric constant associated with a material forming the optical window.

Reflections may also be reduced by configuring the dielectric body 202, the first optical window 222, the second optical window 226, or some combination thereof, to taper as the perimeter wall 210 is approached. This tapering can be accomplished through machining during manufacturing and may allow better impedance matching. The dielectric body 202 can also have subwavelength structures machined into the perimeter wall 210 to prevent reflections and excitations of the plurality of walls 204 and make a response of the vapor in the example vapor cell 200 more uniform during operation.

Figure 4:
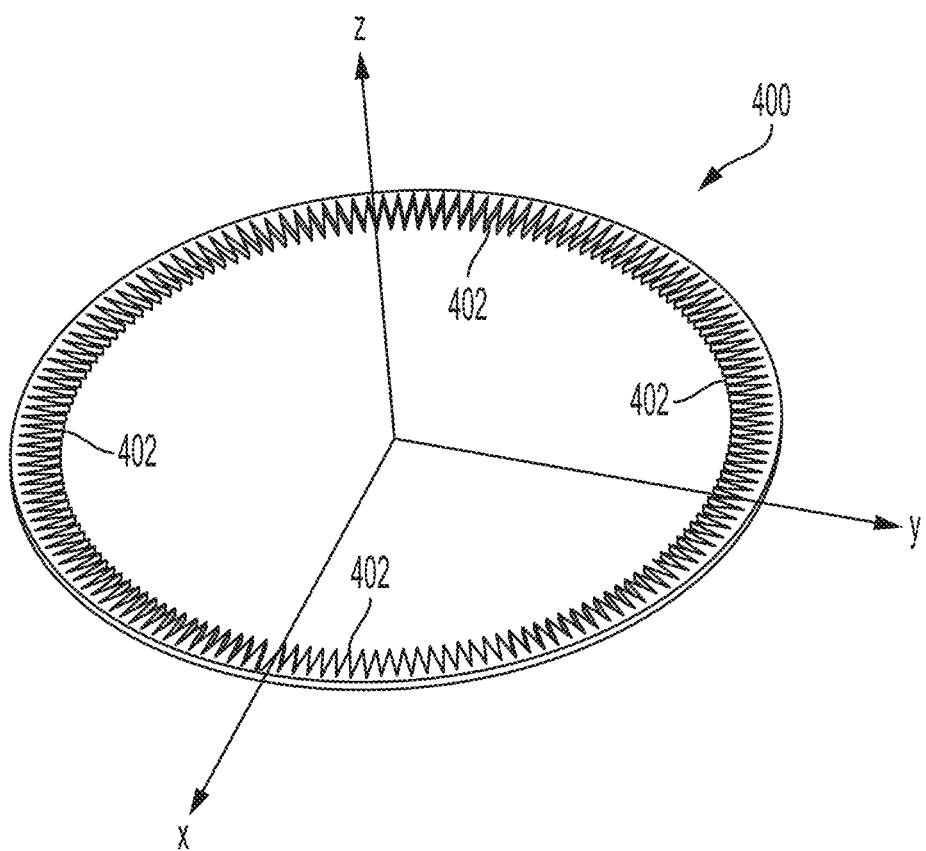
FIG. 4 is a schematic diagram of an example perimeter wall that includes tapered structures protruding into an interior volume.

In some implementations, the example vapor cell 200 is configured to detect a target radiation (e.g., a target radiation having a wavelength of a least 0.3 mm). For example, the perimeter wall 210 comprises a plurality of protrusions that extends into the open volume 214. The plurality of protrusions is operable to impedance match electromagnetic radiation (e.g., the target radiation) propagating towards the perimeter wall 210. Such propagation may, for example, be parallel to one or both of the first and second surfaces 206, 208. The propagation may also be within the open volume 214 of the dielectric body 202 (or the within the plurality of cells 216). In some variations, each of the plurality of protrusions has a maximum dimension no greater than a wavelength of the target radiation. In some variations, the plurality of protrusions is equally spaced along the perimeter wall 210. In some variations, each of the plurality of protrusions tapers into the open volume 214. For example, FIG. 4 presents a schematic diagram of an example perimeter wall 400 that includes tapered structures 402 protruding into an interior volume. The tapered structures 402 correspond to triangular protrusions having a 1 mm base and a 3 mm height and serve to reduce electromagnetic reflections off the perimeter wall 400. The tapered structures 402 may be disposed along the perimeter wall 400 so that an outer portion of the dielectric body is symmetric, such as being symmetric about an axis of revolution (e.g., the z-axis in FIG. 4).

Figure 5A:
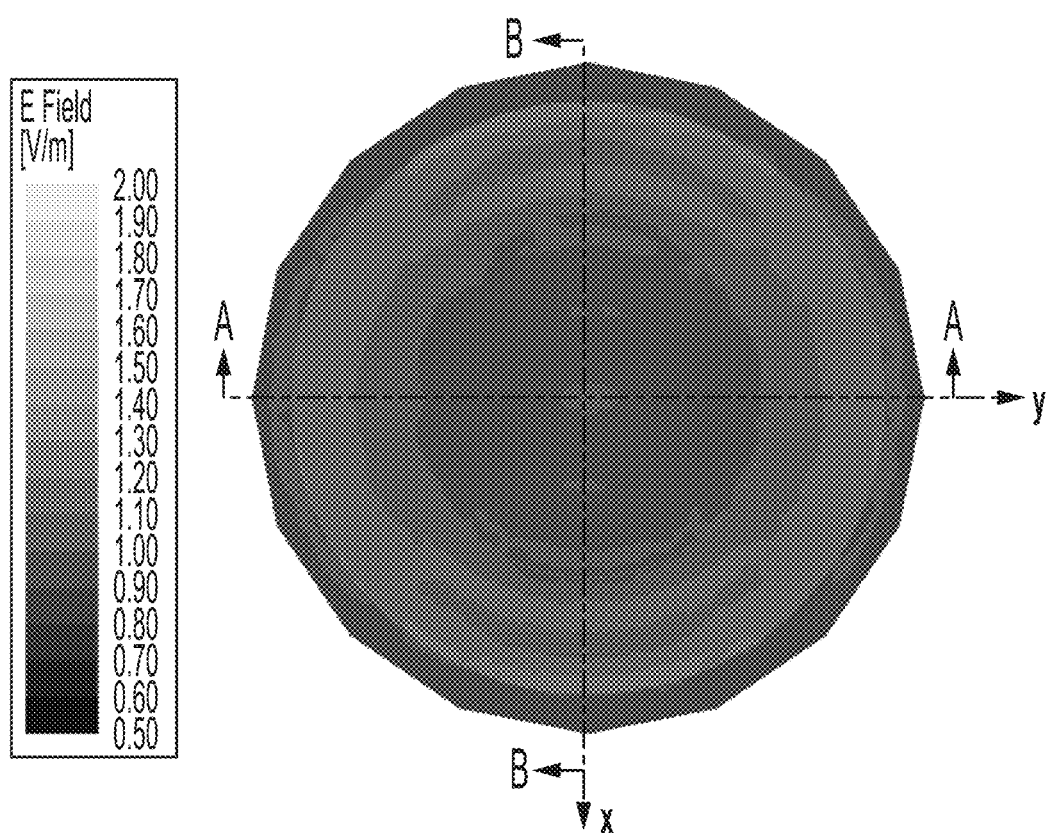
FIG. 5A is a contour graph, shown in top view, of an example vapor cell having optical windows with a tapered effective dielectric constant.
Figure 5B:
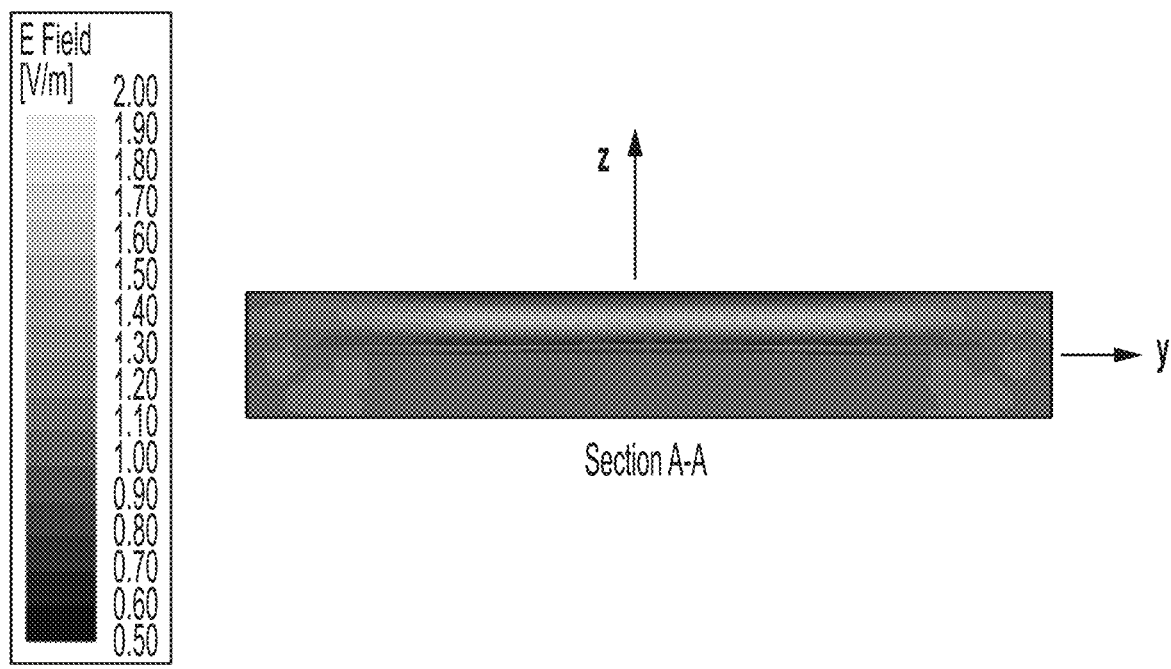
FIG. 5B is a contour graph of the example vapor cell of FIG. 5A but corresponding to a sectional side view perpendicular to the x axis.
Figure 5C:
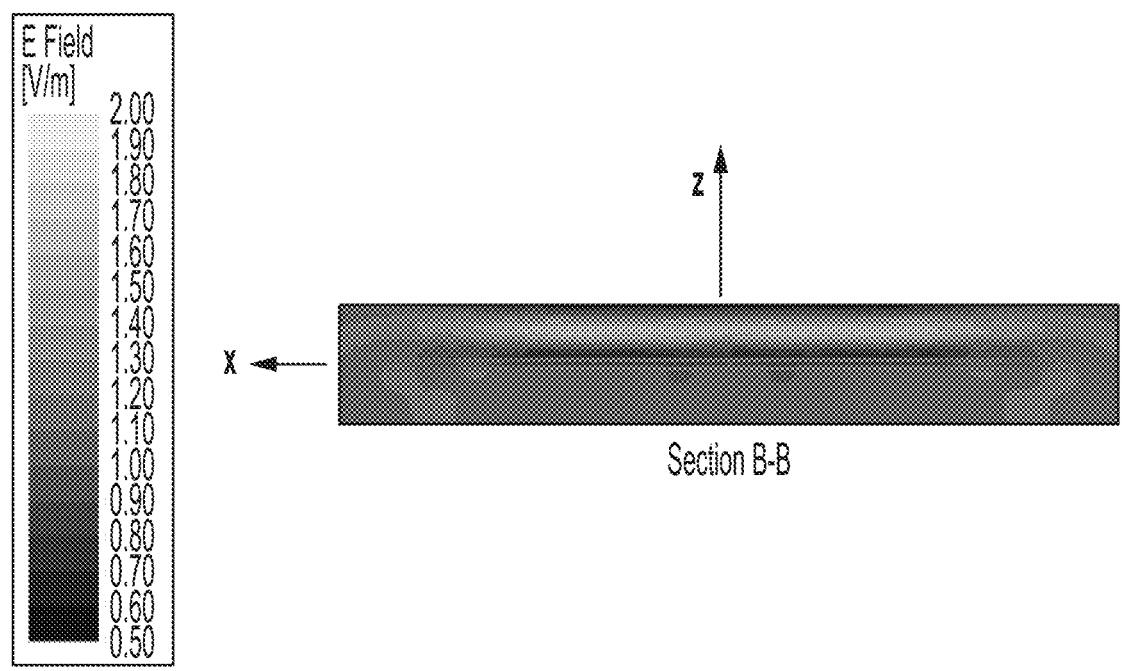
FIG. 5C is a contour graph of the example vapor cell of FIG. 5A but corresponding to a sectional side view perpendicular to they axis.
Figure 5D:
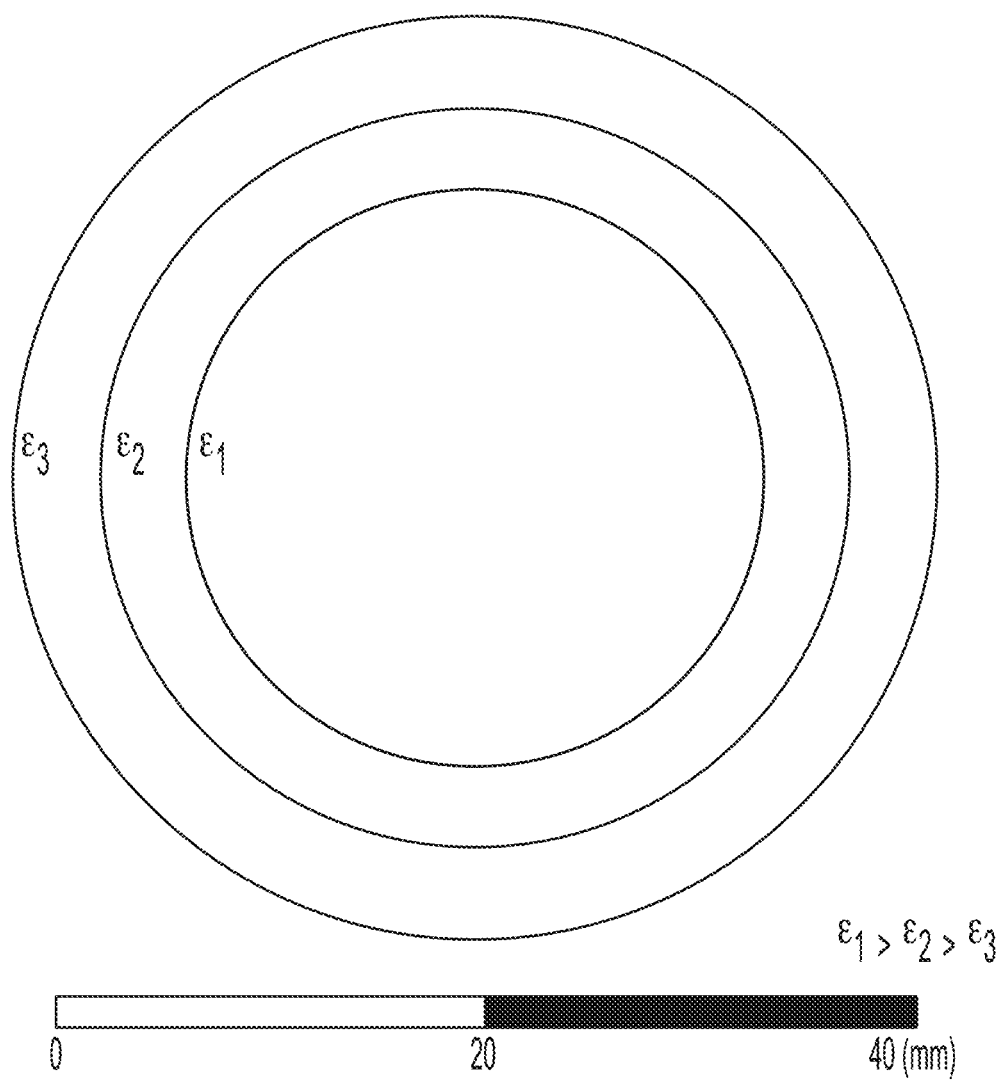
FIG. 5D is a schematic diagram, shown in top view, indicating circular regions of different permittivity in the optical windows of FIG. 5A.
Figure 5E:
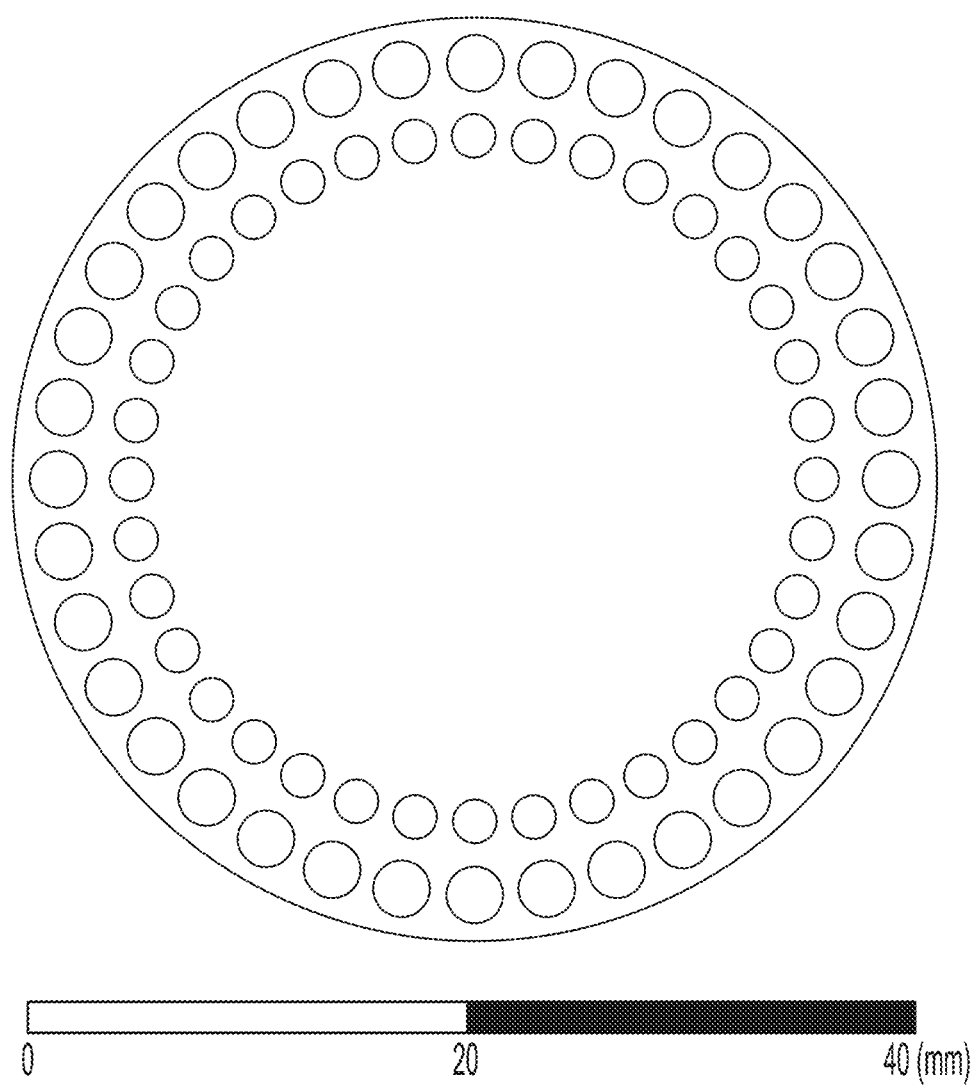
FIG. 5E is a schematic diagram, shown in top view, of an example optical window with circular regions of different permittivity, as shown in FIG. 5D, that result from circular pockets arranged in rotationally-symmetric concentric rings.

Now referring to FIGS. 5A-5C, contour graphs are presented of an example vapor cell having optical windows with a tapered effective dielectric constant. The contour graphs correspond to a top view and two sectional views of the example vapor cell. The tapered dielectric constant may be established using optical windows with circular regions of different permittivity ($\in$), such as shown in FIG. 5D. In this configuration, the optical windows may include several rotationally-symmetric concentric rings of pockets in order to taper the effective dielectric constant. The pockets may be circular, such as shown in FIG. 5E. However, other shapes are possible. Moreover, the pockets may have varying depths and may be distributed in patterns other than that shown in FIG. 5E. Although FIG. 5D depicts three circular regions of different permittivity, the optical windows may have other distributions of permittivity.

The contour graphs indicate a distribution of electric field strength in an example vapor cell, as quantified in units of volts per meter (V/m). The effective dielectric constant of each optical window tapers due to the presence of three circular regions of different permittivity, i.e., an outer ring ($\in=\in_3$), an inner ring ($\in=\in_2$), and a central disc ($\in=\in_1$) bordered by the inner ring. The central disc has a more uniform distribution of electric field strength than a vapor cell in which the optical windows lack a tapering of the dielectric constant. The more uniform distribution is due to a reduction in the reflections from the edge of the structure. The tapering of the permittivity establishes an effective dielectric constant that decreases in magnitude as a radial distance from a center of the vapor cell increases. Such a tapered dielectric constant can reduce electromagnetic wall reflections.

Figure 6A:
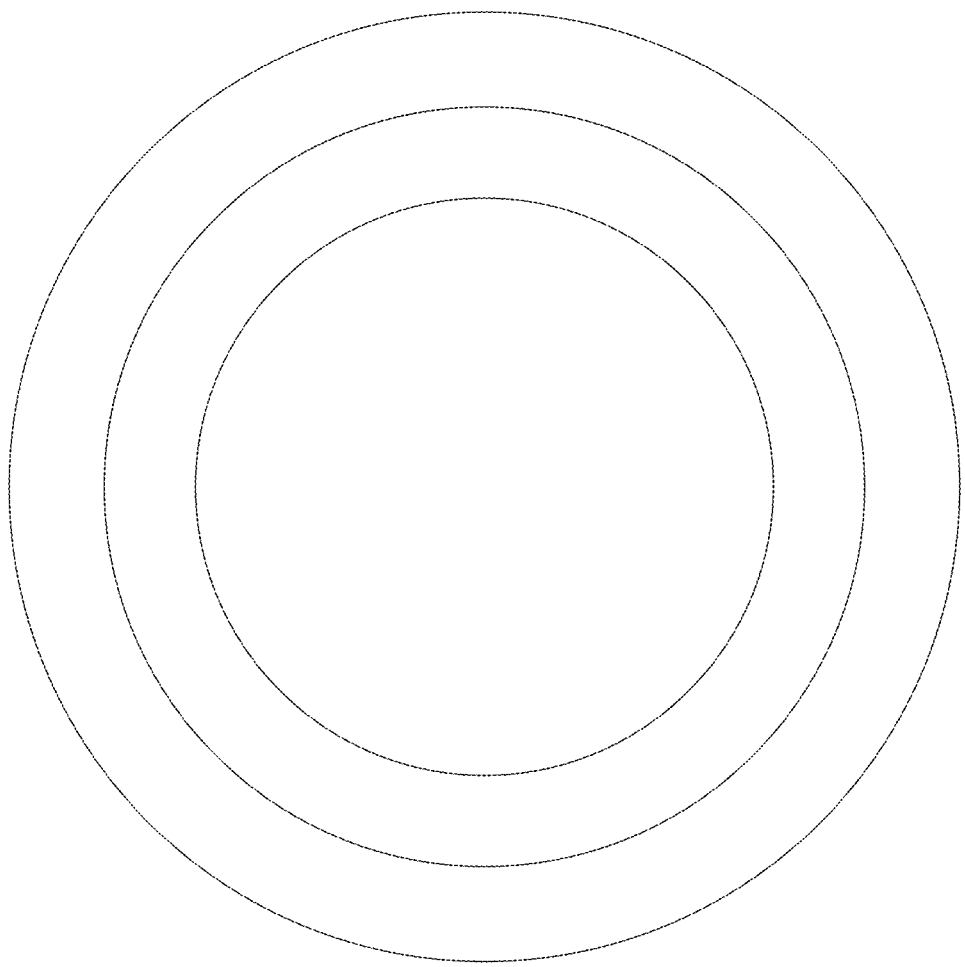
FIG. 6A is a schematic diagram, in top view, of an example optical window having a terraced cross-section that results in a tapered effective dielectric constant.
Figure 6B:
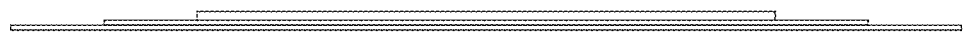
FIG. 6B is a schematic diagram, in side view, of the example optical window of FIG. 6A.

Other configurations of the optical windows are capable of producing an effective dielectric constant that tapers in magnitude. For example, FIG. 6A presents a schematic diagram, in top view, of an example optical window having a terraced cross-section. FIG. 6B shows a side view of the example optical window of FIG. 6A. The terraced cross-section includes three steps to create an optical window thickness that increases when traversing a radial distance from an edge of the example optical window to its interior. In this example, the terraced configuration results in an effective dielectric constant that decreases in magnitude as a radial distance from a center of the example optical window increases. In this example, the effective dielectric constant is capable of producing a distribution of electric field strength, such as shown in the contour graphs of FIGS. 5A-5C.

The measurement of the power of an incoming electromagnetic field can be linked to properties of the atom through the transition dipole moments and fundamental constants. In some cases, using a vapor cell as described here, power can be measured to high precision in a controlled laboratory environment and the vapor cells may provide an absolute, self-calibrated measurement of the electric field. When measuring electromagnetic radiation from the DUT, the vapor cells may provide absolute, self-calibrated measurement of emitted power from the DUT, which along with a reference beam measurement, can be used to extract the phase of the electromagnetic radiation. The measurement can act as a standard for each DUT. Moreover, if the vapor cells are used in a holographic setup with the reference beam, the setup may provide a fully self-calibrated measurement since the reference wave power can be calibrated and stabilized with a Rydberg atom-based power sensor (or vapor cell) as a reference using a feedback loop. The geometry of the vapor cell can be known to 10 micron or less precision by laser cutting the vapor cell frame or etching the vapor cell structure. OTA testing is required by many different stake holders, including telecommunications carriers, electronics manufacturers, and regulatory bodies. OTA testing, which can be linked to standards, can assure compliance with governmental regulations and help to avoid costly design errors. Compliance and testing can help the high frequency electronics industry meet demanding global market schedules and technical specifications.

In some implementations, a method of manufacturing a vapor cell includes obtaining a dielectric body having a first surface and a second surface opposite the first surface. The method also includes removing material from the dielectric body to form a plurality of walls extending from the first surface to the second surface. The plurality of walls includes a perimeter wall surrounding an open volume of the dielectric body and interconnected walls arranged within the open volume to partition the open volume into a plurality of cells. Each of the plurality of cells has a first opening defined by the first surface and a second opening defined by the second surface. The method additionally includes bonding a surface of an optical window to the first surface of the dielectric body to form a seal around each of the first openings. The optical window covers the first openings of the plurality of cells.

In some implementations, the optical window is a first optical window. In these implementations, the method includes disposing a vapor or a source of the vapor into each of the plurality of cells. The method also includes bonding a surface of a second optical window to the second surface of the dielectric body to form a seal around each of the second openings. The second optical window covers the second openings of the plurality of cells to enclose the vapor or the source of the vapor in each of the plurality of cells.

In some implementations, removing material from the dielectric body includes focusing a laser beam onto the dielectric body to machine material therefrom. In some implementations, removing material from the dielectric body includes exposing the dielectric body to a chemical to etch material therefrom. In some implementations, removing material from the dielectric body includes forming a passage through at least one interconnected wall. The passage is configured to allow cells separated by the at least one interconnected wall to fluidly-couple. In some implementations, three or more of the interconnected walls meet at a union. In these implementations, removing material from the dielectric body includes forming a passage through the union, the passage configured to allow cells adjacent the union to fluidly couple.

In some implementations, the vapor cell is configured to detect a target radiation. In such implementations, removing material from the dielectric body includes forming a plurality of protrusions along the perimeter wall that extend into the open volume. In some variations, each of the plurality of protrusions has a maximum dimension no greater than a wavelength of the target radiation. The target radiation may have a wavelength of at least 0.3 mm. However, other wavelengths are possible. In some implementations, obtaining the dielectric body includes removing material from the dielectric body to form the first and second surfaces (e.g., polishing, etching, machining, and so forth).

In some implementations, the method includes before bonding, disposing a vapor or a source of the vapor into each of the plurality of cells. In these implementations, bonding the surface of the optical window includes enclosing the vapor or the source of the vapor in each of the plurality of cavities.

In some implementations, removing material from the dielectric body includes forming a hole through the perimeter wall of the dielectric body to at least one of the plurality of cells. In such implementations, the method includes flowing a vapor through the hole and occluding the hole to seal the vapor in the plurality of cells. In certain variations, the method may further include attaching a tube to the perimeter wall to extend a passage defined by the hole. In these variations, occluding the hole includes closing the end of the tube to seal the vapor in the plurality of cells.

In some implementations, the method includes forming a hole through the optical window. The hole is positioned to fluidly-couple at least one of the plurality of cells to an exterior of the optical window when the surface of the optical window is bonded to the first surface of the dielectric body. The method also includes flowing a vapor through the hole and occluding the hole to seal the vapor in the plurality of cells. In certain variations, the method further includes attaching a tube to the optical window to extend a passage defined by the hole. In these variations, occluding the hole includes closing the end of the tube to seal the vapor in the plurality of cells.

In some implementations, the surface of the optical window is a first window surface and the optical window includes a second window surface opposite the first window surface. In such implementations, the method includes removing material from the optical window to form a plurality of pockets extending partially from the second window surface to the first window surface. In further implementations, a perimeter bounds the first window surface and the second window surface. Removing material from the optical window to form a plurality of pockets may then include forming the plurality of pockets in an arrangement of sizes to define an effective dielectric constant for the optical window. The effective dielectric constant is different from an intrinsic dielectric constant associated with a material forming the optical window.

EXAMPLES

In some cases, methods of manufacturing vapor cells may be implemented according to the following examples. However, examples are for purposes of illustration only. Modifications, both to materials and methods, may be practiced without departing from the scope of the disclosure.

Example 1

A double sided, p-type silicon wafer was obtained with a <100> orientation. The silicon wafer had a diameter of 4-inches and was 500 µm thick with a surface roughness, $R_a$, no greater than 1 nm on each side. Electrical properties of the silicon wafer included a resistance of $10^4$ Ω·cm. A glass wafer formed of borosilicate glass was also obtained from Schott. The glass wafer was a MEMpax wafer having a diameter of 4 inches and a thickness of 300 µm. The surface roughness was less than 0.5 nm.

The silicon and glass wafers were inspected in preparation for anodic and contact bonding. In particular, the wafers were visually inspected for chips, micro-cracks, and scratches. The wafers were also verified to have a surface roughness less than 1 nm. A 500-nm protective layer of $SiO_2$ was grown on both sides of the silicon wafer using a wet growth process in an oxidation furnace. The temperature of the oxidation furnace was set to about 1100° C. and the processing time of the silicon wafer was about 40 min. A thickness uniformity of the silicon wafer (with the $SiO_2$ layers) was verified to be within 500±6 nm over its 4-inch diameter area. The surface roughness was also verified to be less than 1 nm.

The silicon wafer was formed into a silicon frame using either a Protolaser U4 micro-laser tool or Protolaser R micro-laser tool to machine material from the silicon wafer. The silicon frame included a perimeter wall and interconnected walls within the perimeter wall. The interconnected walls defined a plurality of hexagonally-shaped cells. Notches were formed into the interconnected walls to define passages between the plurality of hexagonal-shaped cells. The silicon frame was inspected visually with 5× and 10× magnification loupes for cracks or chips that might have occurred during machining. If the silicon frame had zero or minimal surface defects, the frame was selected for subsequent vapor-cell fabrication.

The silicon frame was then cleaned with methanol and isopropanol using cotton swabs and optical tissue paper. Next, the silicon frame was submerged in a buffered oxide etch (BOE) solution having a 10:1 volume ratio and an etch rate of 55 nm/min at room temperature. The buffered oxide etch solution contained hydrofluoric acid buffered with ammonium fluoride. The silicon frame was submerged for at least 11 minutes to remove the 500-nm protective layer of $SiO_2$ from the surface of each side of the silicon frame. After being removed from the buffered oxide etch, the silicon frame was visually inspected. If embedded material from the machining process was found on a silicon frame, the silicon frame was discarded. If regions of $SiO_2$ remained on the silicon frame, the silicon frame was re-submerged in the buffered oxide etch solution, removed, and then re-inspected. If both sides of the silicon frame were free of the 500-nm protective layer of $SiO_2$, the silicon frame was selected for final cleaning and the growth of a 100-nm $SiO_2$ adhesion layer.

The silicon frame was cleaned with acetone and isopropanol using cotton swabs and optical tissue paper. An ultrasonic cleaner was used to assist the cleaning process by agitating baths of acetone or isopropanol in which the silicon frame was submerged. A 100-nm layer of $SiO_2$ was then grown on one side of the silicon frame. The temperature of the sample in a sputtering chamber was set to a minimum of 600° C. to obtain a surface roughness no greater than 1 nm for the 100-nm layer of $SiO_2$. A thickness uniformity of the 100-nm $SiO_2$ layer was verified to be within 100±6 nm over an area of a silicon frame. If the silicon frame failed this uniformity criterion, the silicon frame was discarded.

The silicon frame with the 100-nm $SiO_2$ layer was then cleaned with methanol and isopropanol using cotton swabs and optical tissue paper to eliminate loose residues on its surfaces (e.g., such as due to handling). The silicon frame was subsequently deep-cleaned with acetone and isopropanol using cotton swabs and optical tissue paper. A low magnification loupe (e.g., 10×) was used during the deep cleaning process for a first visual inspection followed by a high magnification microscope (e.g., 50×-200×) for a second visual inspection. If the silicon frame passed the second vision inspection, the silicon frame was placed in a bath of acetone for ultrasonic cleaning at 40 kHz (e.g., in a Branson Ultrasonic Cleaner CPX-952-117R). For example, the silicon frame could be placed in a glass beaker of acetone and cleaned ultrasonically for 20 minutes at room temperature. After ultrasonic cleaning, the silicon frame was dried with particulate-free compressed air and stored in an air-tight container until needed for bonding.

Separately, the glass wafers were cleaned with methanol and isopropanol using cotton swabs and optical tissue paper. If necessary, the glass wafers were placed in a glass container of acetone and ultrasonically cleaned form 20 minutes at room temperature. After ultrasonic cleaning, the glass wafers were dried with particulate-free compressed air and then stored in an air-tight container until needed for bonding.

One silicon frame and one glass wafer were then placed into an assembly for anodic bonding. For the silicon frame, the planar surface opposite the planar surface defined by the 100-nm layer of $SiO_2$ participated in the anodic bonding process. In the assembly, planar surfaces of silicon frame and the glass wafer were contacted to define an interface, and the interface was visually inspected to confirm that optical fringes were present. The silicon frame was then heated to a temperature of about 400° C. After this temperature was reached, 600V was applied across the silicon and glass chips for about 15 minutes, which drove the formation of an anodic bond. The interface was inspected again to confirm the disappearance of the optical fringes, which indicated the anodic bond was complete. Next, the anodic bond was inspected for defects (e.g., bubbles, micro-cracks, unbonded areas, etc.). If 80% or more of an area around the cells was free of defects, the anodic bond was then further inspected for open channels (e.g., from a hole to the environment, a hole to another hole, etc.). If an open channel was discovered, the anodically-bonded body was discarded as the anodic bond was not deemed leak-tight.

Bonded silicon and glass bodies with leak-tight anodic bonds were cleaned in acetone and methanol. During this cleaning process, the unbonded surface of the silicon frame was cleaned with acetone and methanol using cotton swabs and optical tissue paper to eliminate any residues (e.g., residues from a graphite plate of the assembly used to form the anodic bond). The unbonded surface of the silicon frame was then visually inspected to ensure defects (e.g., scratches, pitting, etc.) were not present that might compromise a soon-to-be formed contact bond. The anodically-bonded body was then individually cleaned. In particular, the anodically-bonded body was placed individually (i.e., with no other chips) in a glass beaker of acetone and cleaned ultrasonically for 20 minutes at room temperature. After ultrasonic cleaning, the anodically-bonded body was dried with particulate-free compressed air. A low magnification loupe (e.g., 10×) was used for a first visual inspection of the anodically-bonded body, followed by a high magnification microscope (e.g., 50×-200×) for a second visual inspection. The first and second visual inspections were used to ensure no visual residues or deposits remained on the anodically-bonded body.

The anodically-bonded body—along with a second glass wafer—was then taken into a clean room environment (e.g., Class 1000 or better) for contact bonding. A planar surface defined by the 100-nm layer of $SiO_2$ on the silicon frame of the anodically-bonded body and a planar surface of the second glass wafer were wiped with optical paper and acetone to clean any macroscopic deposits or contaminants from them. The pair was then submerged in an acetone bath (e.g., acetone in a beaker) and cleaned via ultrasonic cleaning for 15 minutes. The pair was subsequently removed from the acetone bath, rinsed with isopropanol (e.g., submerged in an isopropanol bath), and blown dry with dry nitrogen gas.

The pair was then placed in a YES-CV200RFS plasma system and activated for 45 seconds using a nitrogen plasma. In particular, the planar surface defined by the 100-nm layer of $SiO_2$ on the silicon frame and the planar surface of the glass wafer were plasma activated. The RF-power of the plasma system was set to about 75 W, and the pressure inside was maintained at about 150 mTorr. Nitrogen gas introduced into the plasma system at a volume flow rate of about 20 sccm. After activation by plasma cleaning, the pair was removed from the YES-CV200RFS plasma system and rinsed in de-ionized water for 5 minutes. The rinsing process served to hydroxylate the activated surfaces. In some variations, the rinsing process was conducted with a basic aqueous solution (e.g., an aqueous solution of ammonium hydroxide). Care was taken not to touch the two hydroxylated and activated surfaces together.

Next, a pill of Cs covered in paraffin was placed in the cavity and both pieces were transferred into a vacuum chamber and mounted into a fixture having a "press finger". The fixture held the second glass wafer adjacent the silicon frame of the anodically-bonded body to define a gap. The activated and hydroxylated surface of the glass wafer faced the activated and hydroxylated $SiO_2$ surface of the silicon frame. The vacuum chamber was then sealed and pumped down to a reduced pressure (e.g., less than 10-3 Torr).

Once the pressure in the vacuum chamber reached its desired pressure, the fixture was actuated to contact the activated and hydroxylated surface of the glass wafer to the activated and hydroxylated $SiO_2$ surface of the silicon frame. The "press finger" was used to hold the contacted surfaces together for 20 minutes, which drove the formation of a contact bond. In some variations, the "press finger" was used to apply a target pressure (e.g., about 2 MPa) during the 20-minute duration. The bond was strengthened by annealing it in an oven at approximately 90° C. for 8 hours. The annealing process released the Cs in the paraffin pill.

Example 2

A thick glass wafer was obtained from Howard Glass Co., Inc. with a thickness of 1 mm and a diameter of 4 inches. The thick glass wafer had a surface roughness, $R_a$, no greater than 1 nm on each side. A thin glass wafer formed of borosilicate glass was also obtained from Schott. The thin glass wafer was a MEMpax wafer having a diameter of 4 inches and a thickness of 300 μm. The surface roughness was less than 0.5 nm. The thick and thin glass wafers were inspected in preparation for anodic and contact bonding. In particular, the glass wafers were visually inspected for chips, micro-cracks, and scratches. The wafers were also verified to have a surface roughness less than 1 nm.

A 100 μm Si wafer with a 500 nm layer of $SiO_2$ on a single side was anodically bonded to each side of the thick glass wafer such that the $SiO_2$ layers were exposed on the surface. The 100 μm Si wafer defined a layer of Si on the thick glass wafer. Alternatively, the layer of Si may be deposited on each side of the thick glass layer and the $SiO_2$ may be sputtered on the exposed surfaces. For example, a Si layer no greater than 1 μm thick may be deposited on both sides of the thick glass wafer using plasma-enhanced chemical vapor deposition (PECVD) and a 500-nm protective layer of $SiO_2$ may be sputtered onto each side of the stacked frame.

Next, a glass frame with the Si and $SiO_2$ layers was cut from the thick glass wafer using either a Protolaser U4 micro-laser tool or Protolaser R micro-laser tool to machine material from the glass wafer. The glass frame included a perimeter wall and interconnected walls within the perimeter wall. The interconnected walls defined a plurality of hexagonally-shaped cells. Notches were formed into the interconnected walls to define passages between the plurality of hexagonal-shaped cells. The glass frame was inspected visually with 5× and 10× magnification loupes for cracks or chips that might have occurred during machining. If the glass frame had zero or minimal surface defects, the frame was selected for subsequent vapor-cell fabrication.

The glass frame was then cleaned with methanol and isopropanol using cotton swabs and optical tissue paper.

Next, the glass frame with the Si and $SiO_2$ layers was contacted with (e.g., submerged into) a buffered oxide etch (BOE) solution having a 10:1 volume ratio and an etch rate of 55 nm/min at room temperature. The buffered oxide etch solution contained hydrofluoric acid buffered with ammonium fluoride. The surface was contacted for at least 11 minutes to remove the 500-nm protective layer of $SiO_2$, thereby leaving the Si on the glass frame. After being removed from the buffered oxide etch, the glass frame was visually inspected. If embedded material from the machining process was found on a glass frame, the glass frame was discarded. If regions of $SiO_2$ remained on the glass frame, the glass frame was re-contacted with the buffered oxide etch solution, removed, and then re-inspected. If the surface of the silicon frame was free of the 500-nm protective layer of $SiO_2$, the glass frame was selected for final cleaning.

The glass frame was then cleaned with methanol and isopropanol using cotton swabs and optical tissue paper to eliminate loose residues on their surfaces (e.g., such as due to handling). The glass frame was subsequently deep-cleaned with acetone and isopropanol using cotton swabs and optical tissue paper. A low magnification loupe (e.g., 10×) was used during the deep cleaning process for a first visual inspection followed by a high magnification microscope (e.g., 50×-200×) for a second visual inspection. If the glass frame passed the second vision inspection, the glass frame was placed in a bath of acetone for ultrasonic cleaning at 40 kHz (e.g., in a Branson Ultrasonic Cleaner CPX-952-117R). For example, the glass frame could be placed in a glass beaker of acetone and ultrasonically cleaned for 20 minutes at room temperature. After ultrasonic cleaning, the glass frame was dried with particulate-free compressed air and stored in an air-tight container until needed for bonding.

One glass wafer was selected and a 3 mm hole was cut using one of the Protolaser systems such that the hole could be aligned to one of the cells in the glass frame. The hole is used to fill the vapor cell with Cs using a paraffin coated Cs droplet.

Separately, the thin glass wafers were cleaned with methanol and isopropanol using cotton swabs and optical tissue paper. If necessary, the thin glass wafers were placed in a glass beaker of acetone and ultrasonically cleaned for 20 minutes at room temperature. After ultrasonic cleaning, the thin glass wafers were dried with particulate-free compressed air and then stored in an air-tight container until needed for bonding.

The glass frame (with a layer of Si) and one thin glass wafer were then placed into an assembly for anodic bonding. For the glass frame, the planar surfaces defined by the layers of Si participated in the anodic bonding processes. In the assembly, planar surfaces of the glass frame and the glass wafers were contacted to define an interface, and the interface was visually inspected to confirm that optical fringes were present. The glass wafer was then heated to a temperature of about 400° C. After this temperature was reached, 600V was applied across the contacted glass bodies for about 15 minutes, which drove the formation of an anodic bond. The interface was inspected again to confirm the disappearance of the optical fringes, which indicated the anodic bond was complete. Next, the anodic bond was inspected for defects (e.g., bubbles, micro-cracks, unbonded areas, etc.). If 80% or more of an area around the cells was free of defects, the anodic bond was then further inspected for open channels (e.g., from a hole to the environment, a hole to another hole, etc.). If an open channel was discovered, the anodically-bonded body was discarded as the anodic bond was not deemed leak-tight. The same process was carried for each glass wafer and its corresponding surface on the glass frame.

The anodically-bonded glass body was cleaned in acetone and methanol. During this cleaning process, the window with the 3 mm hole was cleaned with acetone and methanol using cotton swabs and optical tissue paper to eliminate any residues (e.g., residues from the assembly used to form the anodic bond). The window was then visually inspected to ensure defects (e.g., scratches, pitting, etc.) were not present that might compromise a soon-to-be formed contact bond. The anodically-bonded body was then individually cleaned. In particular, the window without the fill hole was cleaned with acetone and methanol. A low magnification loupe (e.g., 10×) was used for a first visual inspection of the anodically-bonded body, followed by a high magnification microscope (e.g., 50×-200×) for a second visual inspection. The first and second visual inspections were used to ensure no visual residues or deposits remained on the anodically-bonded body. A glass wafer, greater than or equal to 5 mm square dimension, was similarly cleaned to prepare it for sealing the fill hole using a contact bond.

The anodically-bonded body—along with the square glass wafer of greater than 5-mm square dimension—were then taken into a clean room environment (e.g., Class 1000 or better) for contact bonding. For the pair, the planar surface of the bonded structure with the fill hole and the planar surface of the glass wafer were wiped with optical paper and acetone to clean any macroscopic deposits or contaminants from them. The pair was subsequently removed from the acetone bath, rinsed with isopropanol and blown dry with dry nitrogen gas. The process was repeated until the surfaces were visually clean using a optical loop.

The bonded structure and window were then placed in a YES-CV200RFS plasma system and activated for 45 seconds using a nitrogen plasma. In particular, the window with the fill hole and the planar glass cover were activated by a plasma. The RF-power of the plasma was set to about 75 W, and the pressure inside was maintained at about 150 mTorr. Nitrogen gas introduced into the plasma system at a volume flow rate of about 20 sccm. After activation by plasma, the pair was removed from the YES-CV200RFS plasma system and rinsed in de-ionized water for 5 minutes. The bonded structure was carefully contacted with the de-ionized water so as to not to fill the cavity with water. The rinsing process served to hydroxylate the activated surfaces. In some variations, the rinsing process was conducted with a basic aqueous solution (e.g., an aqueous solution of ammonium hydroxide). Care was taken not to touch the two hydroxylated and activated surfaces together.

Next, a pill of Cs covered in paraffin was placed in the cavity using the 3 mm hole and both pieces were transferred into a vacuum chamber and mounted into a fixture having a "press finger". The fixture held the glass piece adjacent the glass window of the anodically-bonded body to define a gap. The activated and hydroxylated surface of the glass piece faced the activated and hydroxylated surface of the glass frame. The vacuum chamber was then sealed and pumped down to a reduced pressure (e.g., less than 10-Torr).

Once the pair reached the desired pressure, the fixture was actuated to contact the activated and hydroxylated surface of the glass piece to the activated and hydroxylated surface of the anodically bonded structure. The "press finger" was used to hold the contacted surfaces together for 20 minutes, which drove the formation of a contact bond. In some variations, the "press finger" was used to apply a target pressure (e.g., about 2 MPa) during the 20-minute duration. The bond was strengthened by annealing it around 90° C. for 8 hours. The annealing process released the Cs inside the cavity.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method of manufacturing a vapor cell, the method comprising:
   obtaining a dielectric body having a first surface and a second surface opposite the first surface;
   removing material from the dielectric body to form a plurality of walls extending from the first surface to the second surface, the plurality of walls comprising:
      a perimeter wall surrounding an open volume of the dielectric body, and
      interconnected walls arranged within the open volume to partition the open volume into a plurality of cells, each interconnected wall connected to at least one other interconnected wall, each cell having a first opening defined by the first surface and a second opening defined by the second surface; and
   bonding a surface of an optical window to the first surface of the dielectric body to form a seal around each of the first openings, the optical window covering the first openings of the plurality of cells.

2. The method of claim 1, wherein removing material from the dielectric body comprises focusing a laser beam onto the dielectric body to machine material therefrom.

3. The method of claim 1, wherein removing material from the dielectric body comprises exposing the dielectric body to a chemical to etch material therefrom.

4. The method of claim 1, wherein removing material from the dielectric body comprises forming a passage through at least one interconnected wall, the passage configured to allow cells separated by the at least one interconnected wall to fluidly-couple.

5. The method of claim 1,
   wherein three or more of the interconnected walls meet at a union; and
   wherein removing material from the dielectric body comprises forming a passage through the union, the passage configured to allow cells adjacent the union to fluidly couple.

6. The method of claim 1,
   wherein the vapor cell is configured to detect a target radiation; and
   wherein removing material from the dielectric body comprises forming a plurality of protrusions along the perimeter wall that extend into the open volume, the plurality of protrusions having a maximum dimension no greater than a wavelength of the target radiation.

7. The method of claim 6, wherein the target radiation has a wavelength of at least 0.3 mm.

8. The method of claim 1, wherein obtaining the dielectric body comprises removing material from the dielectric body to form the first and second surfaces.

9. The method of claim 1, comprising:
   before bonding, disposing a vapor or a source of the vapor into each of the plurality of cells;
   wherein bonding the surface of the optical window comprises enclosing the vapor or the source of the vapor in each of the plurality of cavities.

10. The method of claim 1,
    wherein removing material from the dielectric body comprises forming a hole through the perimeter wall of the dielectric body to at least one of the plurality of cells; and
    wherein the method comprises:
       flowing a vapor through the hole, and
       occluding the hole to seal the vapor in the plurality of cells.

11. The method of claim 10, comprising:
    attaching a tube to the perimeter wall to extend a passage defined by the hole;
    wherein occluding the hole comprises closing the end of the tube to seal the vapor in the plurality of cells.

12. The method of claim 1, comprising:
    forming a hole through the optical window, the hole positioned to fluidly-couple at least one of the plurality of cells to an exterior of the optical window when the surface of the optical window is bonded to the first surface of the dielectric body;
    flowing a vapor through the hole; and
    occluding the hole to seal the vapor in the plurality of cells.

13. The method of claim 12, comprising:
    attaching a tube to the optical window to extend a passage defined by the hole;
    wherein occluding the hole comprises closing the end of the tube to seal the vapor in the plurality of cells.

14. The method of claim 1,
    wherein the surface of the optical window is a first window surface and the optical window comprises a second window surface opposite the first window surface; and
    wherein the method comprises:
       removing material from the optical window to form a plurality of pockets extending partially from the second window surface to the first window surface.

15. The method of claim 14,
    wherein a perimeter bounds the first window surface and the second window surface; and
    wherein removing material from the optical window to form a plurality of pockets comprises:
       forming the plurality of pockets in an arrangement of sizes to define an effective dielectric constant for the optical window, the effective dielectric constant different from an intrinsic dielectric constant associated with a material forming the optical window.

16. The method of claim 1,
wherein the optical window is a first optical window; and
wherein the method comprises:
- disposing a vapor or a source of the vapor into each of the plurality of cells; and
- bonding a surface of a second optical window to the second surface of the dielectric body to form a seal around each of the second openings, the second optical window covering the second openings of the plurality of cells to enclose the vapor or the source of the vapor in each of the plurality of cells.

17. A vapor cell, comprising:
a dielectric body comprising:
- a first surface,
- a second surface opposite the first surface, and
- a plurality of walls extending from the first surface to the second surface, the plurality of walls comprising:
  - a perimeter wall surrounding an open volume of the dielectric body, and
  - interconnected walls arranged within the open volume to partition the open volume into a plurality of cells, each interconnected wall connected to at least one other interconnected wall, each cell having a first opening defined by the first surface and a second opening defined by the second surface;
a vapor or a source of the vapor in each of the plurality of cells;
a first optical window covering the first openings and having a surface bonded to the first surface of the dielectric body to form a seal around each of the first openings; and
a second optical window covering the second openings and having a surface bonded to the second surface of the dielectric body to form a seal around each of the second openings.

18. The vapor cell of claim 17,
wherein the vapor cell is configured to detect a target radiation; and
wherein the perimeter wall comprises a plurality of protrusions that extend into the open volume, the plurality of protrusions having a maximum dimension no greater than a wavelength of the target radiation.

19. The vapor cell of claim 18, wherein the plurality of protrusions are equally spaced along the perimeter wall.

20. The vapor cell of claim 18, wherein each of the plurality of protrusions tapers into the open volume.

21. The vapor cell of claim 18, wherein the target radiation has a wavelength of at least 0.3 mm.

22. The vapor cell of claim 17, wherein one or both of the first optical window and the second optical window comprise:
- a first window surface opposite a second window surface, the first window surface bonded to the dielectric body; and
- a plurality of pockets extending partially from the second window surface to the first window surface.

23. The vapor cell of claim 17, wherein one or both of the first optical window and the second optical window have an effective dielectric constant different from an intrinsic dielectric constant associated with a material forming the optical window.

24. The vapor cell of claim 17, wherein one or both of the first optical window and the second optical window comprise:
- a first window surface opposite a second window surface, the first window surface bonded to the dielectric body; and
- a plurality of pockets extending partially from the second window surface to the first window surface and being arranged in size to define an effective dielectric constant for the optical window, the effective dielectric constant different from an intrinsic dielectric constant associated with a material forming the optical window.

25. The vapor cell of claim 24, wherein the plurality of pockets decrease in size along a direction parallel to the second window surface to define a tapered effective dielectric constant.

26. The vapor cell of claim 17, wherein at least one interconnected wall comprises a passage fluidly-coupling cells separated by the at least one interconnected wall.

27. The vapor cell of claim 17, wherein three or more of the interconnected walls meet at a union and the union comprises a passage fluidly-coupling cells adjacent the union.

28. The vapor cell of claim 17, wherein the first optical window comprises a dielectric mirror.

29. The vapor cell of claim 28, wherein the dielectric mirror is disposed along the surface of the first optical window bonded to the first surface of the dielectric body.

30. The vapor cell of claim 17, wherein the second optical window comprises an anti-reflection coating.

* * * * *

UNITED STATES PATENT AND TRADEMARK OFFICE
CERTIFICATE OF CORRECTION

PATENT NO. : 11,112,298 B2
APPLICATION NO. : 16/996652
DATED : September 7, 2021
INVENTOR(S) : Amarloo et al.

Page 1 of 1

It is certified that error appears in the above-identified patent and that said Letters Patent is hereby corrected as shown below:

On the Title Page

Page 2, Item (56) Column 2, Line 27, Delete "<Umar ," and insert -- Kumar , -- therefor In the Specification Column 2, Line 9, Delete "they" and insert -- the $y$ -- therefor Column 7, Line 20, Delete "$Si_2$," and insert -- $SiO_2$, -- therefor Column 7, Line 29, Delete "$Y:Zr_2$," and insert -- $Y:ZrO_2$, -- therefor Column 16, Line 15, Delete "10-3" and insert -- $10^{-3}$ -- therefor Column 18, Line 59, Delete "10-Torr)." and insert -- $10^{-3}$Torr). -- therefor Signed and Sealed this
Second Day of November, 2021

Drew Hirshfeld
*Performing the Functions and Duties of the*
*Under Secretary of Commerce for Intellectual Property and*
*Director of the United States Patent and Trademark Office*